United States Patent [19]
Izumi

[11] Patent Number: 5,459,331
[45] Date of Patent: Oct. 17, 1995

[54] SEMICONDUCTOR DEVICE, HETEROJUNCTION BIPOLAR TRANSISTOR, AND HIGH ELECTRON MOBILITY TRANSISTOR

[75] Inventor: Shigekazu Izumi, Itami, Japan

[73] Assignee: Mitsubishi Denki Kabushiki Kaisha, Tokyo, Japan

[21] Appl. No.: 190,892

[22] Filed: Feb. 3, 1994

[30] Foreign Application Priority Data

May 10, 1993 [JP] Japan .................. 5-107917

[51] Int. Cl.$^6$ ............ H01L 27/12; H01L 45/00; H01L 29/80; H01L 29/72
[52] U.S. Cl. .............. 257/17; 257/25; 257/194; 257/197
[58] Field of Search .................... 257/17, 22, 25, 257/197, 198, 201, 191, 23, 29, 192, 194

[56] References Cited

U.S. PATENT DOCUMENTS

| | | | |
|---|---|---|---|
| 4,088,515 | 5/1978 | Blakeslee et al. | 257/22 X |
| 5,017,973 | 5/1991 | Mizuta et al. | 257/25 X |
| 5,146,295 | 9/1992 | Imanaka et al. | 257/22 |
| 5,166,766 | 11/1992 | Grudkowski et al. | 257/22 X |
| 5,258,632 | 11/1993 | Sawada | 257/20 X |

FOREIGN PATENT DOCUMENTS

| | | |
|---|---|---|
| 62-11221 | 1/1987 | Japan . |
| 63-156356 | 6/1988 | Japan . |
| 63-186416 | 8/1988 | Japan . |
| 64-74764 | 3/1989 | Japan . |
| 1120061 | 5/1989 | Japan . |
| 2199825 | 8/1990 | Japan . |
| 3280419 | 12/1991 | Japan . |
| 469922 | 3/1992 | Japan . |
| 472740 | 3/1992 | Japan . |
| 4177737 | 6/1992 | Japan . |

Primary Examiner—William Mintel
Attorney, Agent, or Firm—Leydig, Voit & Mayer

[57] ABSTRACT

A semiconductor device includes a laminated structure including a GaAs layer and an InGaAs layer grown on the GaAs layer and through which operating current flows perpendicular to the InGaAs layer. The InGaAs layer includes a plurality of very thin GaAs layers through which most of the operating current passes by tunneling, located within the InGaAs layer and spaced apart at intervals larger than a critical thickness at which a pseudomorphic state of an InGaAs crystal grown on a GaAs crystal is maintained. Therefore, segregation of In atoms, i.e., unfavorable movement of In atoms, toward the surface of the growing InGaAs crystal, that occurs when the InGaAs layer is grown at a high temperature, and loss of In atoms is suppressed by the very thin GaAs layers. Thus, the InGaAs layer can be grown on the GaAs layer at a high temperature without degrading the surface morphology of the InGaAs layer. An InGaAs layer with improved surface morphology, reduced contact resistance and sheet resistivity, and an improved uniformity of this resistance and resistivity in a wafer can be grown.

10 Claims, 18 Drawing Sheets

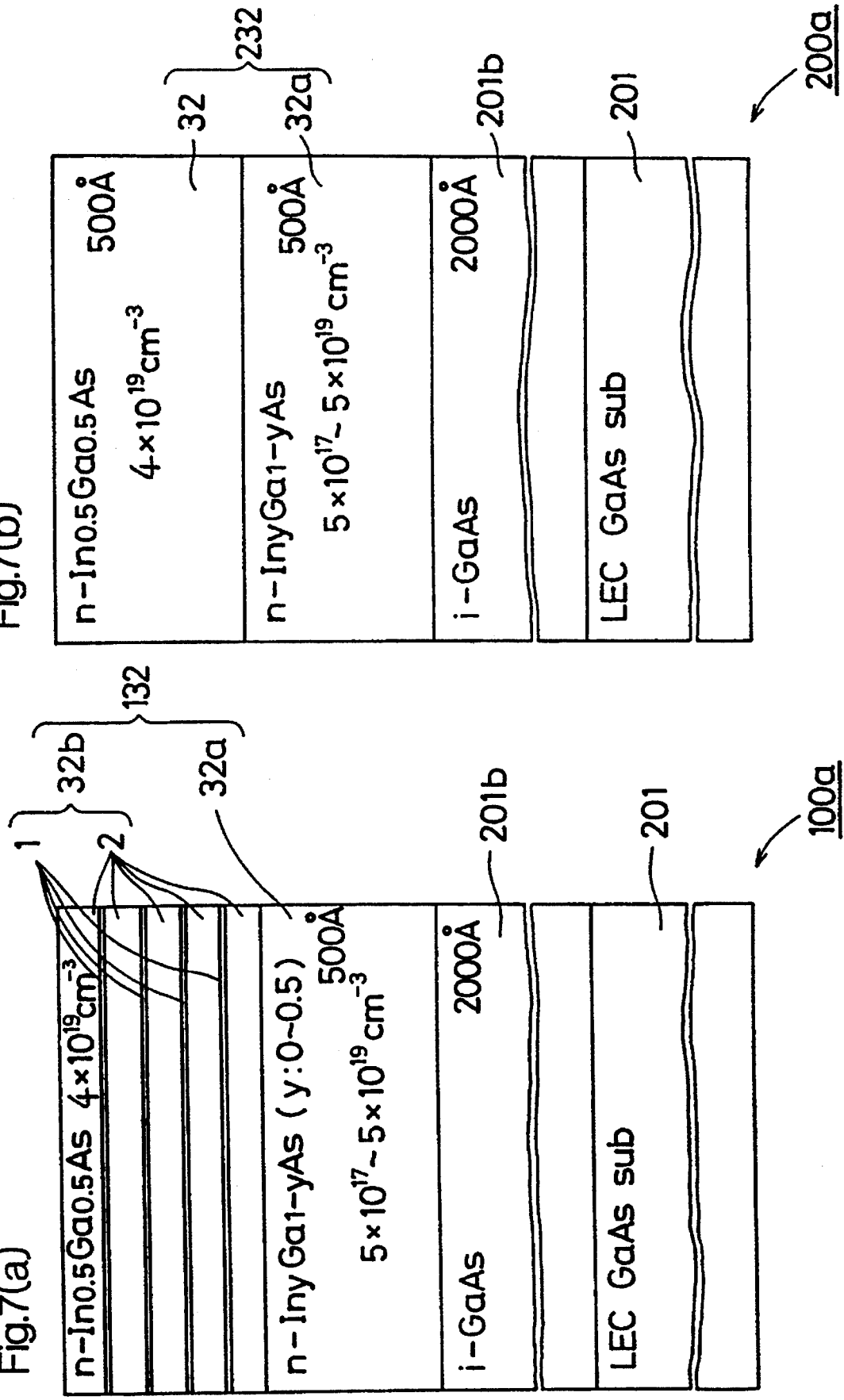

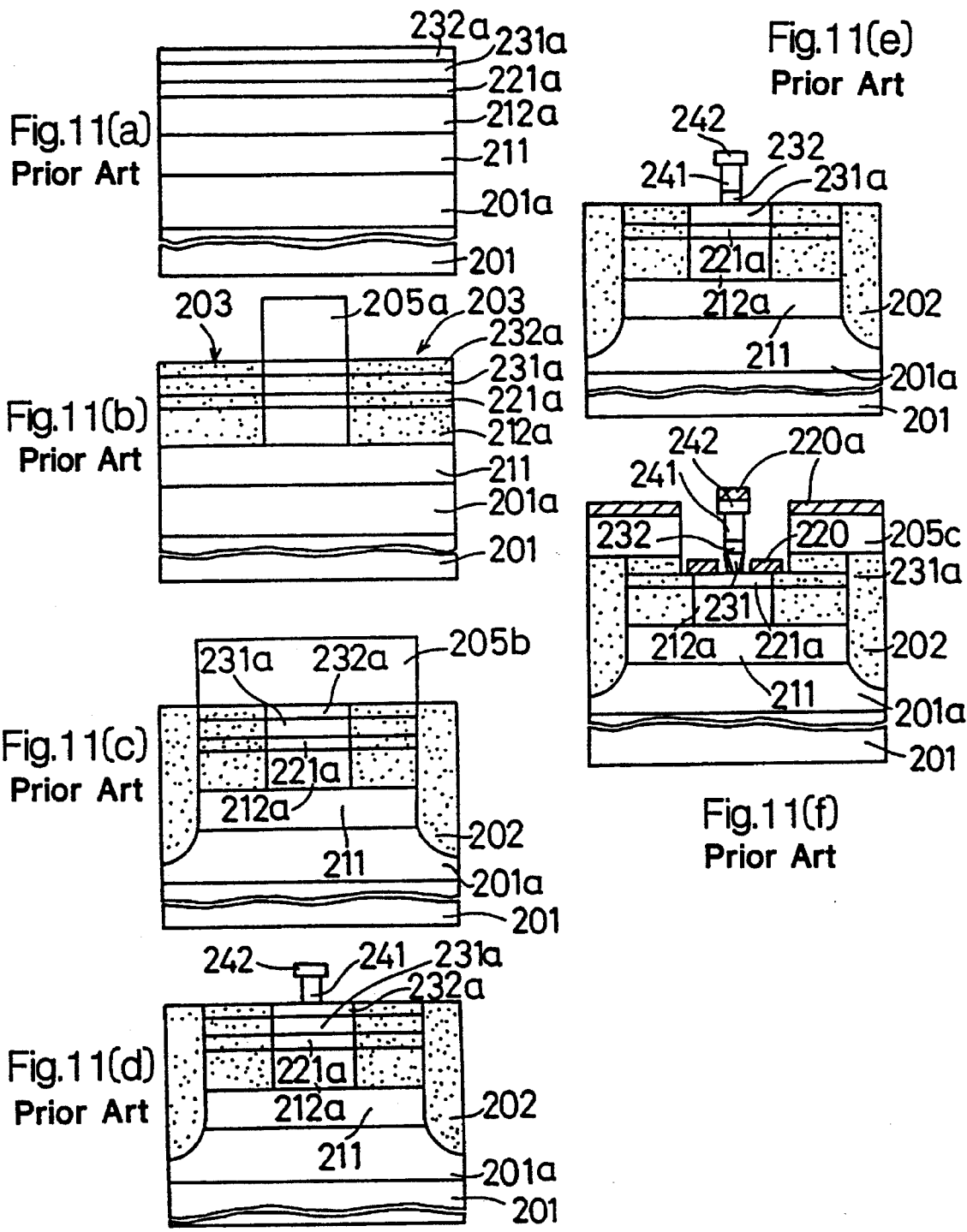

10a (GaAs)

10b (InAs)

- In
◇ Ga
○ As

SEMICONDUCTOR DEVICE, HETEROJUNCTION BIPOLAR TRANSISTOR, AND HIGH ELECTRON MOBILITY TRANSISTOR

FIELD OF THE INVENTION

The present invention relates to semiconductor devices having heterojunctions, such as HBTs (Heterojunction Bipolar Transistors) and HEMTs (High Electron Mobility Transistors) and, more particularly, to an improvement of surface morphology of a lattice mismatch crystal structure comprising a base semiconductor layer and a semiconductor layer having a lattice constant different from that of the base layer and grown on the base layer to a thickness larger than the critical thickness.

BACKGROUND OF THE INVENTION

FIG. 10 is a perspective view illustrating a prior art HBT. In the figure, an HBT 200 includes a GaAs substrate 201 which is produced by a liquid encapsulated Czochralski method (hereinafter referred to as LEC). A buffer layer 201a about 1 μm thick is disposed on the GaAs substrate 201. The buffer layer 201a comprises an intrinsic type (hereinafter referred to as i type) GaAs/AlGaAs superlattice layer about 800 nm thick and an i type GaAs layer about 200 nm thick layer. A collector contact layer 211 is disposed on the buffer layer 201a. A collector layer 212 is disposed on a center part of the collector contact layer 211, and collector electrodes 210 comprising three layers of AuGe/Ni/Au are disposed on the collector contact layer 211 at opposite sides of and spaced apart from the collector layer 212. The collector contact layer 211 comprises an n$^+$ type GaAs layer having a thickness of 500 nm and a dopant concentration of $5 \times 10^{18}$ cm$^{-3}$, and the collector layer 212 comprises an n type GaAs layer having a thickness of 500 nm and a dopant concentration of $5 \times 10^{16}$ cm$^{-3}$.

A p$^+$ type AlGaAs base layer 221 is disposed on the collector layer 212. The base layer 221 has a thickness of 100 nm and a dopant concentration of $1 \sim 4 \times 10^{19}$ cm$^{-3}$. An n type AlGaAs emitter layer 231 is disposed on a center part of the base layer 221. The emitter layer 231 has a thickness of 150 nm and a dopant concentration of $5 \times 10^{17}$ cm$^{-3}$. Base electrodes 220 comprising three layers of Ti/Ni/Au are disposed on the base layer 221 at opposite sides of and spaced apart from the emitter layer 231. In the AlGaAs base layer 221, the ratio of AlAs mixed crystal gradually increases upward from 0 to 0.1. The emitter layer 231 comprises three AlGaAs layers, i.e., an AlGaAs layer grown on the base layer 221 with the AlAs mixed crystal ratio gradually increasing upward from 0.1 to 0.3, an Al$_{0.3}$Ga$_{0.7}$As layer grown thereon to a prescribed thickness, and an AlGaAs layer grown thereon with the AlAs mixed crystal ratio gradually decreasing upward from 0.3 to 0.

An n$^+$ type InGaAs emitter contact layer is disposed on the emitter layer 231. The emitter contact layer 232 has a thickness of 100 nm and a dopant concentration of $4 \times 10^{19}$ cm$^{-3}$. An emitter electrode 230 comprising three layers of Ti/Mo/Au is disposed on the emitter contact layer 232. In the emitter contact layer 232, the ratio of InAs mixed crystal gradually increases upward from 0 to 0.5. Since the emitter contact layer 232 reduces the contact resistance between the emitter layer 231 and the emitter electrode 230, InGaAs having a low contact resistance with the emitter electrode 230 and a low sheet resistivity is employed as the emitter contact layer 232. Insulating regions 202 contact the opposite sides of the collector contact layer 211 and reach the surface of the buffer layer 201a. Insulating regions 203 contact opposite sides of the base layer 221 and the collector layer 212.

A method for manufacturing the HBT of FIG. 10 is illustrated in FIGS. 11(a)–11(f) and 12(a)–12(f).

Initially, an i type GaAs layer 201a about 1 μm thick, an n$^+$ type GaAs layer 211 about 500 nm thick, and an n type GaAs layer 212a about 500 nm thick are successively grown on the GaAs substrate 201. Thereafter, a p$^+$ type AlGaAs layer 221a is epitaxially grown on the n type GaAs layer 212a to a thickness of 100 nm while gradually increasing the ratio of AlAs mixed crystal from 0 to 0.1.

Then, an AlGaAs layer is epitaxially grown on the p$^+$ type AlGaAs layer 221a in the following manner. That is, in the initial stage of the epitaxial growth, the AlGaAs layer is grown while gradually increasing the AlAs mixed crystal ratio from 0.1 to 0.3 until a prescribed thickness is achieved and, thereafter, the AlGaAs layer is grown while maintaining the AlAs mixed crystal ratio at 0.3 until a prescribed thickness is achieved and, finally, the AlGaAs layer is grown while gradually decreasing the AlAs mixed crystal ratio from 0.3 to 0, completing an n type AlGaAs graded layer 231a having a thickness of 150 nm.

Then, an n$^+$ type InGaAs layer is epitaxially grown on the AlGaAs graded layer 231a while gradually increasing the InAs mixed crystal ratio from 0 to 0.5, forming an n$^+$ type InGaAs graded layer 232a having a thickness of 100 nm (FIG. 11(a)).

Thereafter, using a first photoresist film 205a having a prescribed pattern as a mask, protons are implanted, reaching the boundary between the n type GaAs layer 212a and the n$^+$ type GaAs layer 211, forming first insulating regions 203 (FIG. 11(b)). Then, using a second photoresist film 205b as a mask, protons are implanted, reaching into the buffer layer 201a, forming second insulating regions 202 (FIG. 11(c)).

Thereafter, a dummy emitter 241 comprising an insulating film is formed on a part of the InGaAs layer 232a, and a mask pattern 242 comprising WSi or Au and wider than the dummy emitter 241 is formed on the dummy emitter 241 (FIG. 11(d)). The mask pattern 242 is used in a subsequent lift-off process. Using the dummy emitter 241 as a mask, the n$^+$ InGaAs layer 232a is etched to form an emitter contact layer 232 (FIG. 11(e)).

Then, a photoresist film is deposited and patterned to form a third photoresist pattern 205c having an aperture around the dummy emitter 241. Using the photoresist pattern 205c as a mask, the n type AlGaAs layer 231a is selectively etched to from an emitter layer 231. Thereafter, a base metal layer 220a is deposited over the entire surface (FIG. 11(f)), and the photoresist pattern 205c and overlying portions of the base metal layer 220a are removed by a lift-off technique, leaving base electrodes 220 (FIG. 12(a)).

Then, a fourth photoresist film 205d is deposited over the entire surface so that the upper surface of the photoresist film 205d reaches the lower surface of the mask pattern 242. Using the photoresist film 205d as a mask, the dummy emitter 241, the mask pattern 242, and the base metal 220a are removed (FIG. 12(b)).

Then, an emitter metal 230a is deposited over the entire surface (FIG. 12(c)), and the fourth photoresist film 205d and overlying portions of the emitter metal 230a are removed by a lift-off technique, leaving an emitter electrode 230 (FIG. 12(d)).

Thereafter, two grooves are formed penetrating through portions of the n type AlGaAs graded layer 231a, p+ type AlGaAs layer 221a, and n type GaAs layer 212a at opposite sides of the emitter electrode 230, and collector electrodes 210 are formed in the respective grooves (FIG. 12(e)).

Finally, a surface protection film 206 is formed over the entire surface, and portions of the surface protection film 206 on the collector electrodes 210 are removed to form apertures 206a. Then, a wiring layer 207 is formed on the surface protection film 206 so that the wiring layer 207 is in contact with the collector electrodes 210 through the apertures 206a of the surface protection film 206 (FIG. 12(f)). The spaced apart portions of the wiring layer 207 in contact with the respective collector electrodes 210 at opposite sides of the collector layer 212 are connected to each other by an air bridge wiring 207a.

A problem in manufacturing the HBT resides in the process of growing the n+ type $In_yGa_{1-y}As$ layer 232a (emitter contact layer 232) on the n type $Al_yGa_{1-y}As$ (y: 0.1~0.3~0) graded layer 231a (emitter layer 231), i.e., on a GaAs layer.

A description is given of the problem in the growth of an $In_yGa_{1-y}As$ layer (y: 0~1.0) on a GaAs layer, which layers have different lattice constants, to a prescribed thickness that provides a sufficiently low contact resistance.

FIGS. 13(a)–13(b) are diagrams for explaining a GaAs crystal lattice and an InAs crystal lattice, respectively, and FIG. 13(c) is a graph illustrating lattice constant (a) vs. energy band gap (EG) characteristics of AlGaAs and InGaAs which are typical III-V mixed crystal semiconductors. In FIG. 13(a), a unit cell of the crystal lattice of GaAs (hereinafter referred to as GaAs crystal) 10a comprises As atoms 11 and Ga atoms 12 and has a lattice constant of 5.6535 Å. In FIG. 13(b), a unit cell of the crystal lattice of InAs (hereinafter referred to as InAs crystal) 10b comprises As atoms 11 and In atoms 13 and has a lattice constant of 6.0584 Å.

The III-V compound semiconductors include mixed crystal semiconductors comprising three elements, such as AlGaAs and InGaAs, besides the above-described compound semiconductors comprising two elements. In these ternary compound semiconductors, the energy band gap (EG) can be continuously varied by varying the AlAs or InAs crystal ratio. AlGaAs is especially favorable as a constituent of a semiconductor device because the lattice constant of AlGaAs do not vary with the variation of the AlAs mixed crystal ratio. However, the energy band gap of AlGaAs is larger than that of GaAs. On the other hand, the energy band gap of InGaAs is smaller than that of GaAs. Therefore, for the purpose of reducing the resistance of a semiconductor layer included in a device, InGaAs has an advantage over GaAs.

However, the lattice constant of InGaAs having an InAs mixed crystal ratio of 1, i.e., the lattice constant $a_2$ of the InAs crystal, is different from the lattice constant $a_1$ of the GaAs crystal by 7.2%. Therefore, a coherent single crystal is not attained due to dislocations when an $In_yGa_{1-y}As$ layer is grown on a GaAs layer. In FIG. 14(a), a crystal structure of a monocrystalline $In_{0.5}Ga_{1-0.5}As$ layer 20b (lattice constant $a_{12}$) is compared with a crystal structure of a monocrystalline GaAs layer 20a (lattice constant $a_1$).

As shown in FIG. 14(b), when the thickness $T_1$ of the InGaAs layer 20b is small, the lattice mismatch generated by the dislocations of the crystal lattice is eased by the strain of the crystal lattice, and a pseudomorphic crystal structure is attained. Therefore, the monocrystalline InGaAs layer 20b can be grown on the GaAs layer 20a.

On the other hand, in the crystal growth of InGaAs, segregation of In atoms, i.e., escape of In atoms in the InGaAs layer 20b toward the surface of the layer (FIG. 15(a)), or loss of In atoms occurs, resulting in a crystal defect that facilitates dislocations. If the thickness of $In_yGa_{1-y}As$ having a lattice constant that does not match with the lattice constant of GaAs exceeds a critical thickness $T_O$, a dislocation 22 is produced by the crystal defect, and the strain of the InGaAs crystal is relaxed. As a result, the pseudomorphic structure is destroyed in a part $21b_1$ exceeding the critical thickness $T_O$ of the $In_yGa_{1-y}As$ layer 21b grown on the GaAs layer 20a as shown in FIG. 15(b), and incoherent or polycrystalline InGaAs is grown. Further, in such a crystal growth, the segregation of In atoms and the loss of In atoms are facilitated, so that a favorable surface morphology of the InGaAs layer is not attained.

As shown in FIG. 16, the critical thickness $T_O$ of the InGaAs layer decreases with an increase in the InAs mixed crystal ratio (y) of the InGaAs layer. For example, the critical thicknesses at InAs mixed crystal ratios of 0.15 and 0.2 are 250 Å and 200 Å, respectively. If the critical crystal thickness is exceeded, pseudomorphic crystal growth is impossible.

Therefore, if an InGaAs layer grown on a GaAs layer to a thickness exceeding the critical thickness $T_O$ is applied to an HBT, fine patterns of insulating films and conductive films cannot be formed on the InGaAs layer with high reproducibility because of the rough surface of the InGaAs layer.

This problem will be described concretely.

For example, when the dummy emitter 241 is formed by patterning an insulating film in the above-described HBT production process, if the insulating film 241a and the metal layer 242a are formed on the n+ type InGaAs layer 232a having a rough surface, as shown in FIG. 17(a), the rough surface of the InGaAs layer 232a adversely affects the surface morphologies of the insulating film 241a and the metal layer 242a.

If a photoresist film is deposited and patterned on the metal layer 242a, the side surface 215 of the patterned photoresist film 205 is rough due to the irregular reflection of light used to expose the film (FIG. 17(a)). When the metal layer 242a and the insulating film 241a are patterned using the photoresist pattern 205 as a mask, the side surfaces 42 and 41 of the patterned metal layer 242 and the patterned insulating dummy emitter 241, respectively, are rough because of the rough side surface 215 of the photoresist pattern 205 and the rough surfaces of the metal layer 242a and the insulating film 241a (FIG. 17(b)). Therefore, a fine dummy emitter is not attained, which makes it difficult to form a fine emitter.

While in the above-described HBT production process the space between the emitter layer 231 and the base electrode 220 depends on the width of the over-hanging portion of the metal film 242 on the dummy emitter 241 (FIG. 11(d)), a side wall may be interposed between the emitter layer 231 and the base electrode 220. In this case, however, it is difficult to form the side wall.

FIG. 18 is a sectional view illustrating an HBT including side walls 235 interposed between the emitter layer 231 and the respective base electrodes 220. In FIG. 18, the same reference numerals as in FIG. 10 designate the same or corresponding parts. These side walls 235 contact the opposite side surfaces of the GaAs emitter layer 231 and the InGaAs emitter contact layer 232, after the formation of these layers, and serve as a mask for patterning the emitter electrode 230. After the device is completed, these side walls 235 serve as insulators between the respective base electrodes 220 and the emitter electrode 30. Further, since the portions of the base layer 221 between the emitter layer 231 and the respective base electrodes 220 are covered with the side walls 235, surface recombination current at these portions is reduced.

In the production of the HBT shown in FIG. 18, if the surface morphology of the InGaAs layer that is to be the emitter contact layer 232 is rough, a photoresist film formed on the InGaAs layer for patterning of the emitter layer and the emitter contact layer has rough side surfaces, with a result that the side walls are not favorably formed on the side surfaces of the emitter layer and the emitter contact layer.

As described above, in the crystal structure formed by growing an InGaAs layer on a GaAs layer, a favorable surface morphology of the InGaAs layer is not achieved. If such a crystal structure is applied to a device, such as an HBT, it is difficult to form a fine pattern on the InGaAs layer.

Meanwhile, Japanese Published Patent Application No. Hei. 3-280419 discloses a method for growing an n type InGaAs layer on a GaAs layer. In this prior art Publication, in order to avoid degradation of the surface morphology of the InGaAs layer, the InGaAs layer is grown at a low temperature. However, in the low temperature growth for improving the surface morphology, a crystal structure of good quality is not attained, whereby the contact resistance between the semiconductor layer and the metal layer and the sheet resistivity unfavorably increases. In addition, uniformity in the contact resistivity and the sheet resistivity in a wafer are reduced.

Japanese Published Patent Application No. Hei. 4-72740 discloses an ohmic electrode comprising a superlattice layer disposed on a GaAs substrate and a metal layer disposed on the superlattice layer. The superlattice layer comprises alternating n type $In_xGa_{1-x}As$ layers and n type $In_yGa_{1-y}As$ layers, in which both of the indium composition ratios x and y gradually increase upward while maintaining the relation of x<y, and the n type $In_yGa_{1-y}As$ layer is present at the top of the superlattice layer, whereby dislocation in the superlattice layer are suppressed and a low resistance ohmic contact is realized. In this structure, however, compositions of the n type $In_xGa_{1-x}As$ layer and the n type $In_yGa_{1-y}As$ layer must be precisely controlled. Furthermore, since the compositions of these layers are gradually varied, an interface having a large difference in lattice constants is not present in the superlattice layer. Therefore, the segregation of In atoms that causes the rough surface morphology is not effectively prevented.

Further, Japanese Published Patent Application No. Sho. 63-186416 discloses a compound semiconductor substrate comprising an Si substrate and a high electron mobility compound semiconductor layer, such as GaAs, grown on the Si substrate. The compound semiconductor layer comprises alternating $In_{0.3}Ga_{0.7}As$ layers and GaAs layers which prevent dislocation at the interface between the substrate and the compound semiconductor layer from spreading in the compound semiconductor layer, and the thickness of each layer of the alternating compound semiconductor layers is larger than the critical thickness, whereby the quality of the compound semiconductor layer is improved. In addition, an increase in the thickness improves reproducibility. In the alternating compound semiconductor layers, however, the GaAs layer having an energy band gap larger than that of the $In_{0.3}Ga_{0.7}As$ layer is as thick as 500 Å, so that the sheet resistivity of the alternating layers is significantly increased due to the GaAs layer. Therefore, this structure is unfavorable to an improvement of device characteristics.

Further, Japanese Published Patent Application No. Sho. 63-156356 discloses a pnp bipolar transistor including an emitter layer of a strained superlattice structure in which a plurality of p type InGaAs layers of large lattice constant and small energy band gap and a plurality of p type GaAs layers of small lattice constant and large energy band gap are alternatingly laminated, whereby the effective mass of holes in the emitter layer is reduced to realize an operating speed as high as that of an npn transistor.

However, in the strained superlattice structure, two layers of different lattice constants, i.e., the InGaAs layer and the GaAs layer, are in the pseudomorphic state, so that this structure is not for preventing the degradation of surface morphology of a lattice mismatch lamination structure.

As described above, in the conventional crystal structure in which an $In_yGa_{1-y}As$ layer is grown on a GaAs layer, if the epitaxial growth is carried out at a low temperature to improve the surface morphology, the contact resistivity and the sheet resistivity are unfavorably increased and the uniformities of these resistivities in a wafer are reduced. On the contrary, if the epitaxial growth is carried out at a high temperature to avoid these problems, segregation and loss of In atoms adversely affect the surface morphology. Accordingly, the crystal growth of InGaAs on GaAs has been a problem in realizing a high-performance HBT.

SUMMARY OF THE INVENTION

An object of the present invention is to provide a semiconductor device including an $In_yGa_{1-y}As$ layer grown on a GaAs layer at a high temperature, in which the $In_yGa_{1-y}As$ layer has improved surface morphology, reduced contact resistivity and sheet resistivity, and high uniformities of these resistivities in a wafer.

Another object of the present invention is to provide a high-performance HBT including an InGaAs emitter contact layer grown on a GaAs emitter layer in which the InGaAs emitter contact layer has reduced contact resistivity between the emitter contact layer and an emitter electrode, reduced sheet resistivity, high uniformities of these resistivities in a wafer, and improved surface morphology that results in a fine emitter with high reproducibility.

Still another object of the present invention is to provide a high-performance HEMT including InGaAs source and drain contact layers grown on a GaAs emitter layer in which the InGaAs source and drain contact layers have reduced contact resistivity between the source and drain contact layers and source and drain electrodes, reduced sheet resistivity, high uniformities of these resistivities in a wafer, and improved surface morphology that results in a fine source and drain with high reproducibility.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor device includes a laminated structure comprising a GaAs layer and an InGaAs layer grown on the GaAs layer, through which an operating current flows in the thickness direction of the InGaAs layer. The InGaAs layer includes a plurality of very thin GaAs layers through which most of the operating current passes by tunneling. These GaAs layers are inserted into the InGaAs layer at prescribed intervals wider than a critical thickness that maintains a pseudomorphic state of an InGaAs crystal grown on a GaAs crystal. Therefore, segregation of In atoms, i.e., unfavorable movement of In atoms in the growing InGaAs crystal toward the surface, which occurs remarkably when the InGaAs layer is grown at a high temperature, and loss of In atoms can be suppressed by the very thin GaAs layers, so that the InGaAs layer can be grown on the GaAs layer at a high temperature without degrading the surface morphology of the InGaAs layer. As the result, an InGaAs layer with improved surface morphology, reduced contact resistivity and sheet resistivity, and improved uniformities of these resistivities in a wafer can be grown on the GaAs layer. Furthermore, since the thickness of the very thin GaAs layer is selected so that most of the operating current passes through that layer, the insertion of the very thin GaAs layers in the InGaAs layer does not increase the resistance.

According to a second aspect of the present invention, in the above-described semiconductor device, the InGaAs layer is disposed on an InGaAs graded layer that is grown on the GaAs layer while gradually increasing the ratio of InAs mixed crystal from 0 to a prescribed value in a layer having a thickness larger than the critical thickness.

According to a third aspect of the present invention, in the above-described semiconductor device, the InGaAs graded layer has the InAs mixed crystal ratio gradually increasing upward from 0 to 0.5, and the InGaAs layer disposed on the InGaAs graded layer is a contact layer with the InAs mixed crystal ratio of 0.5 on which an electrode is to be disposed.

According to a fourth aspect of the present invention, an HBT includes a monocrystalline GaAs emitter layer and an emitter contact layer disposed on the emitter layer. The emitter contact layer comprises an InGaAs graded layer which is grown on the GaAs emitter layer to a thickness larger than the critical thickness of InGaAs while gradually increasing the InAs mixed crystal ratio from 0 to a prescribed value, and an InGaAs surface layer grown on the graded layer to a thickness larger than the critical thickness while maintaining the InAs mixed crystal ratio at the prescribed value. The InGaAs surface layer includes a plurality of very thin GaAs layers which are inserted in the InGaAs surface layer at prescribed intervals larger than the critical thickness of InGaAs, through which most of the operating current passes by tunneling. Therefore, the emitter contact layer can be grown at a high temperature without degrading the surface morphology. Since the surface morphology of the emitter contact layer is improved, fine patterns of insulating and conductive film are formed on the emitter contact layer with high reproducibility. Furthermore, since the contact resistivity and the sheet resistivity of the emitter contact layer are suppressed, an HBT element with improved operating characteristics is achieved at good yield.

According to a fifth aspect of the present invention, an HEMT includes InGaAs source and drain contact layers disposed on an n type AlGaAs layer supplying a two-dimensional electron gas via n type GaAs layers. Each of the n type InGaAs contact layers includes a plurality of very thin GaAs layers inserted into the InGaAs layer at prescribed intervals larger than the critical thickness of InGaAs, through which most of the operating current passes by tunneling. Therefore, the InGaAs source and drain contact layers can be grown at a high temperature without degrading the surface morphology, whereby an HEMT having improved operating characteristics is achieved at good yield.

BRIEF DESCRIPTION OF THE DRAWINGS

FIGS. 7(a) and 7(b) are sectional views of samples used for measuring characteristics of the InGaAs with super-periodic GaAs layer according to the present invention and characteristics of the InGaAs layer according to the prior art, respectively.

FIGS. 11(a)–11(f) and 12(a)–(f) are sectional view illustrating process steps in a method for fabricating the HBT of FIG. 10.

DETAILED DESCRIPTION OF THE PREFERRED EMBODIMENTS

Figure 1:
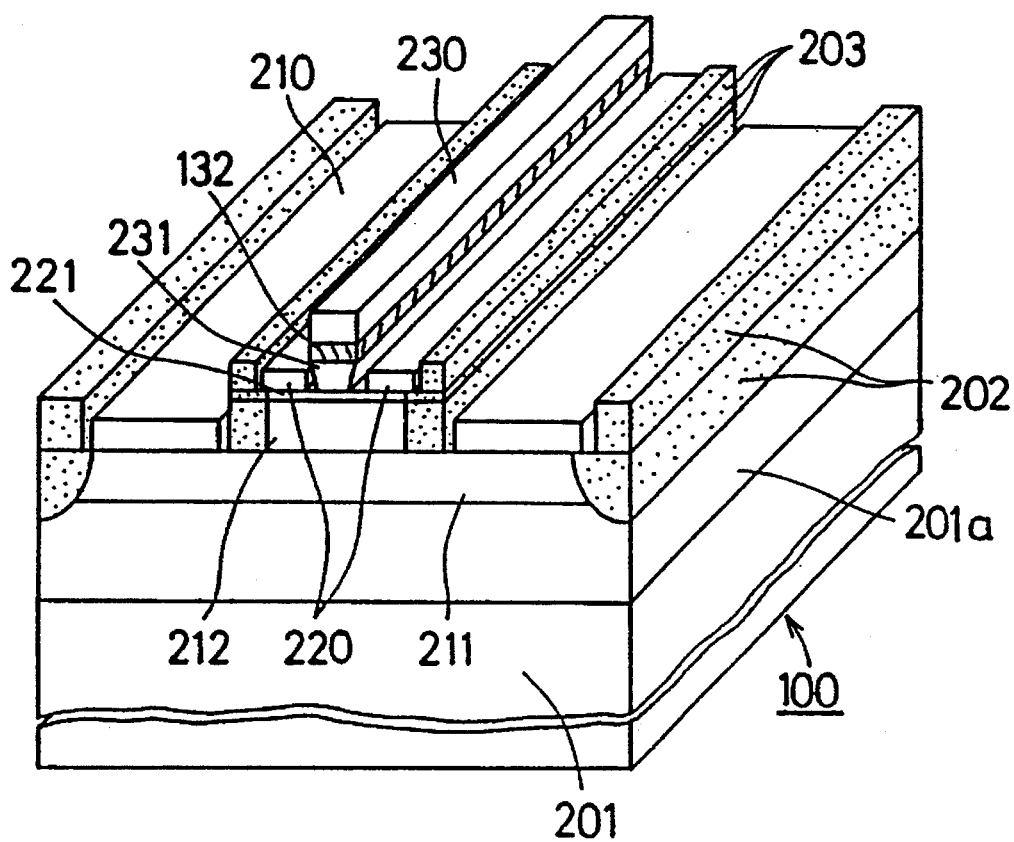
FIG. 1 is a perspective view illustrating an HBT in accordance with a first embodiment of the present invention.
Figure 10:
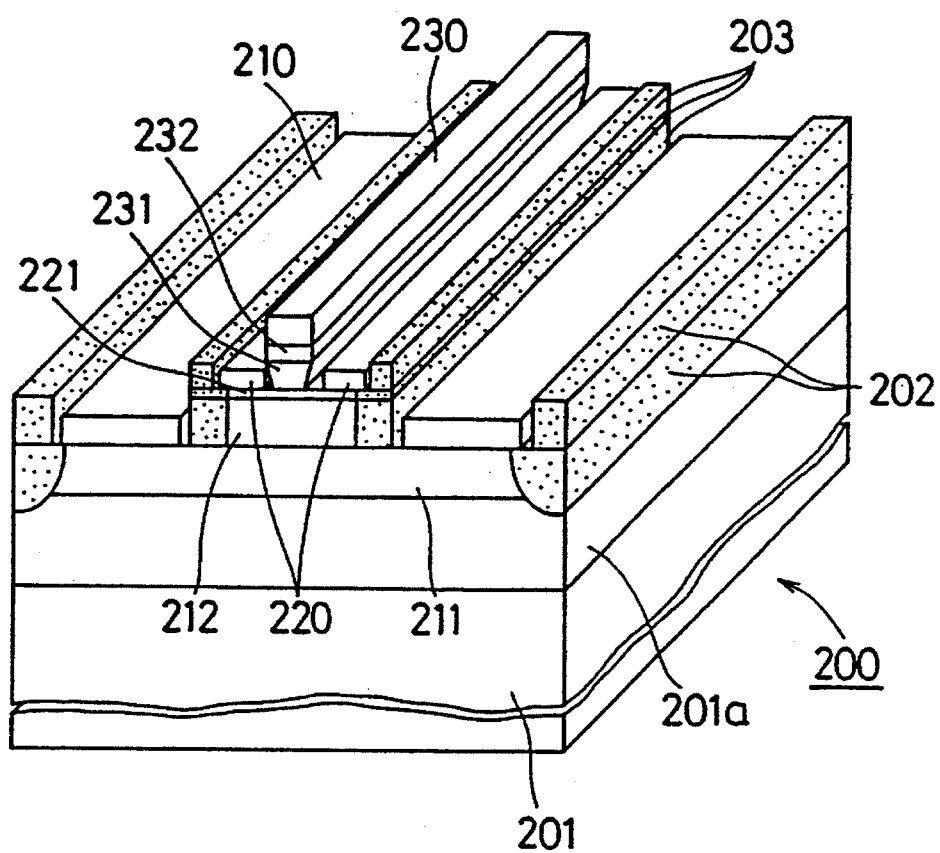
FIG. 10 is a perspective view illustrating an HBT according to the prior art.
Figure 12A:
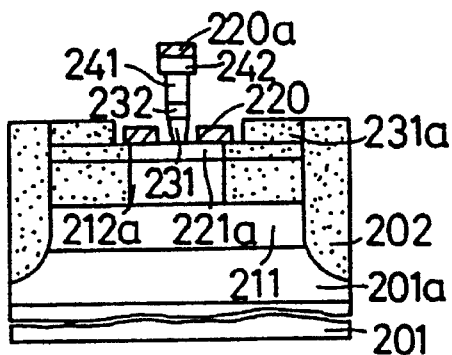
Figure 12D:
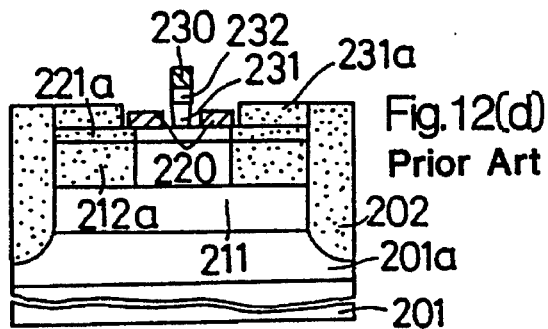
Figure 12B:
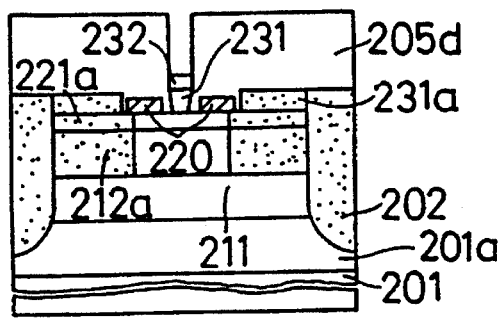
Figure 12E:
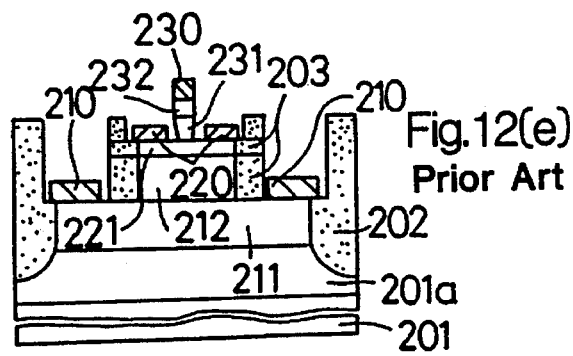
Figure 12C:
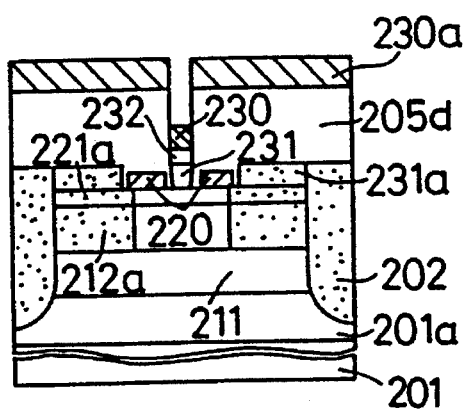
Figure 12F:
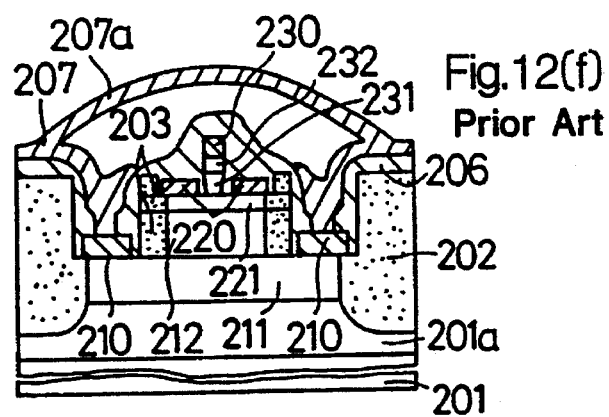
Figure 13A:
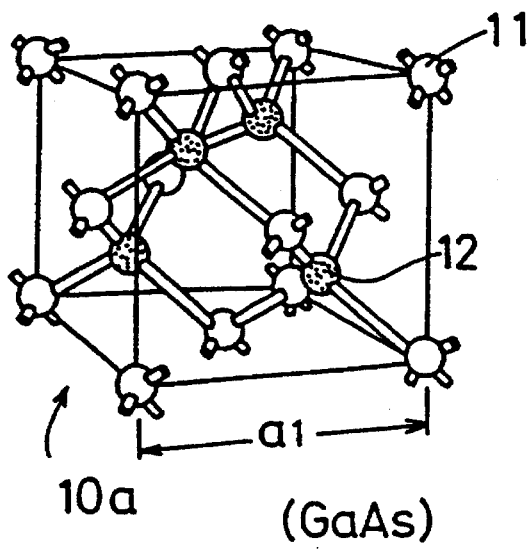
FIGS. 13(a) and 13(b) are diagrams illustrating unit cells of a GaAs crystal lattice and an InAs crystal lattice, respectively.
Figure 13B:
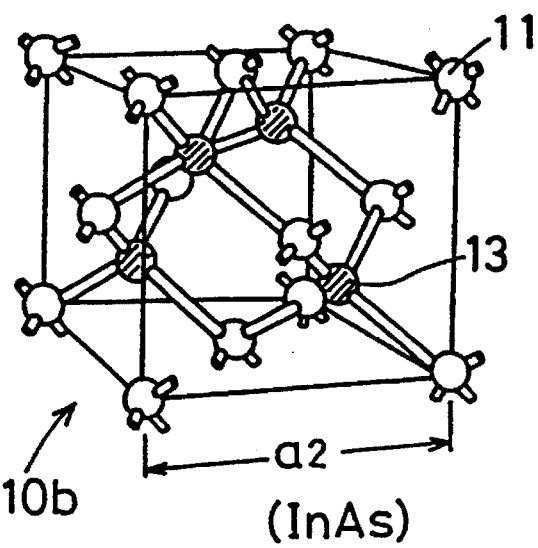
Figure 13C:
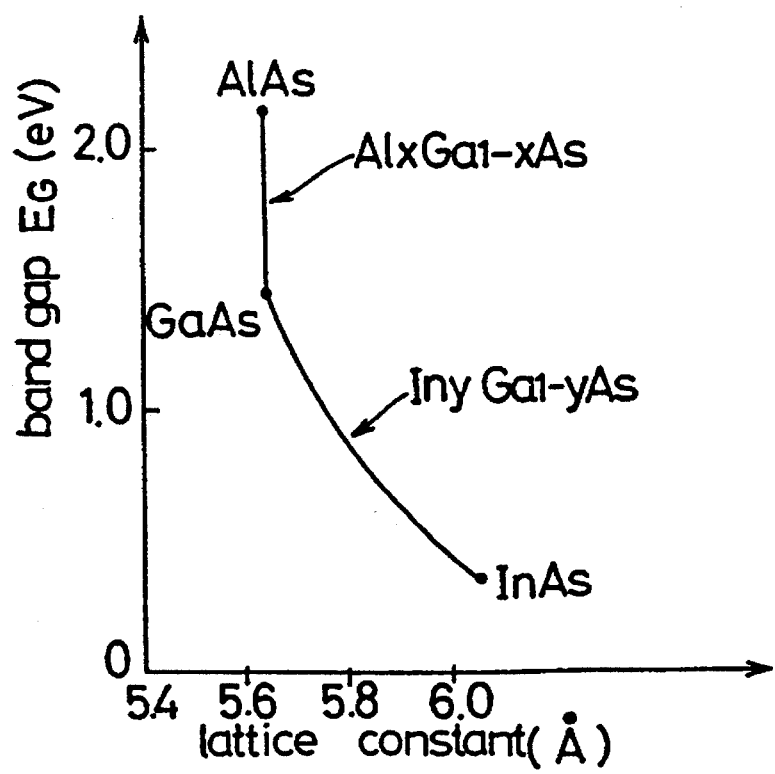
FIG. 13(c) is a graph illustrating the relationships between lattice constants of AlGaAs and InGaAs and the energy band gaps thereof.
Figure 14A:
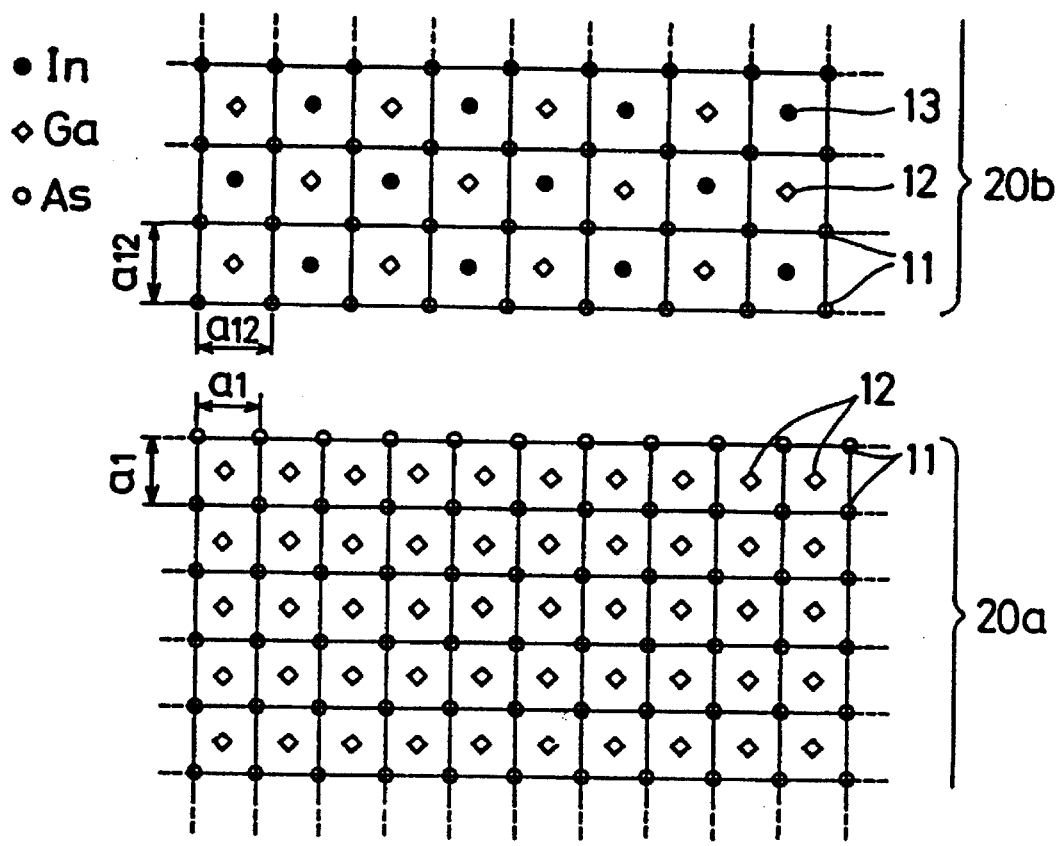
FIG. 14(a) is a diagram illustrating crystal structures of an $In_{0.5}Ga_{1-0.5}As$ layer and a GaAs layer, respectively.
Figure 14B:
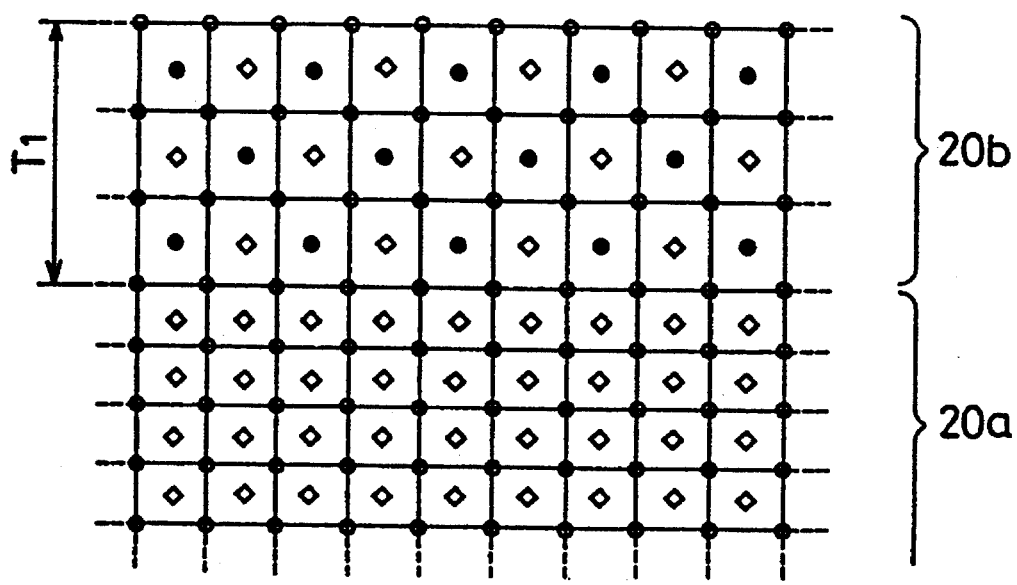
FIG. 14(b) is a diagram illustrating the InGaAs layer and the GaAs layer in a pseudomorphic state.
Figure 15A:
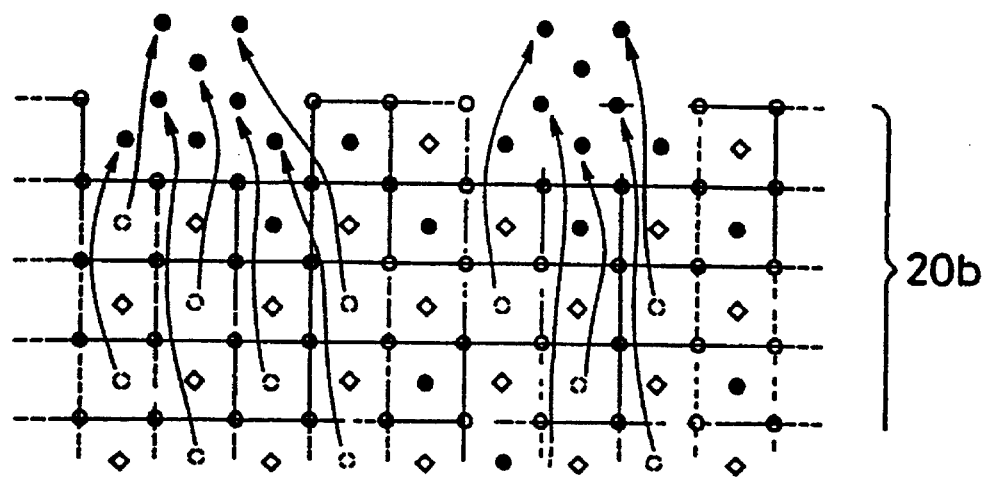
FIGS. 15(a) and 15(b) are diagrams for explaining segregation of In atoms and dislocations, respectively.
Figure 15B:
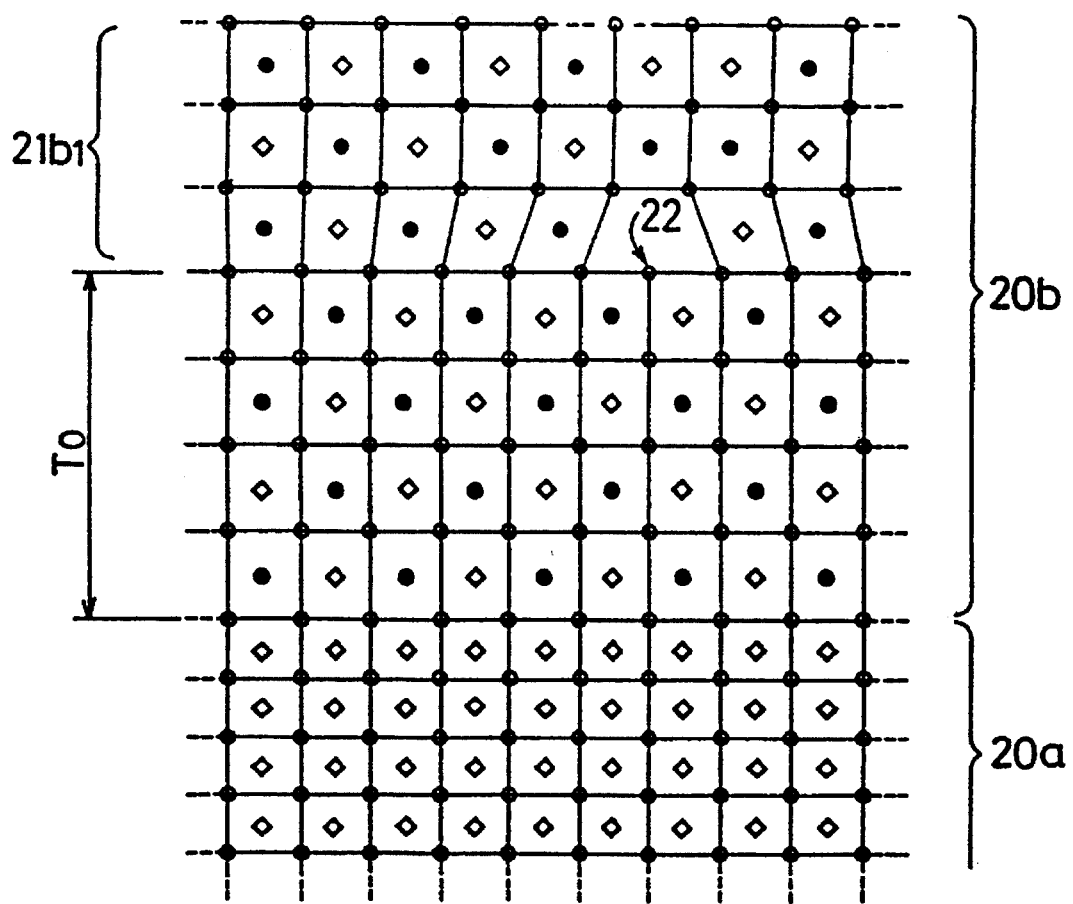
Figure 16:
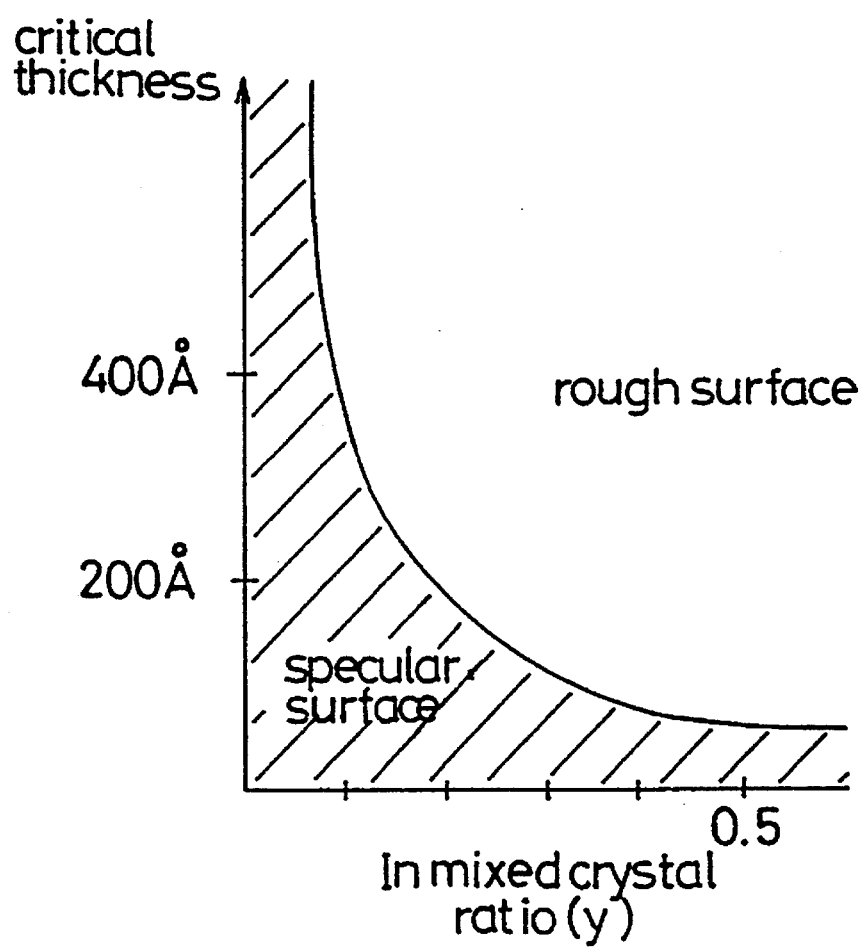
FIG. 16 is a graph illustrating critical thickness vs. InAs mixed crystal ratio of an InGaAs layer grown on a GaAs layer.
Figure 17A:
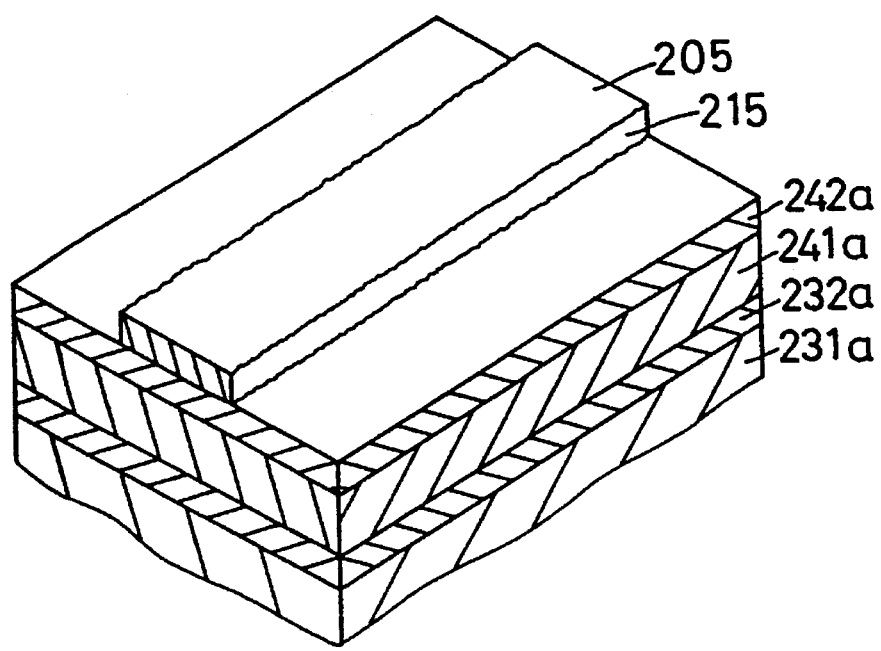
FIGS. 17(a) and 17(b) are perspective views for explaining problems in a processor forming a dummy emitter in the prior art production method.
Figure 17B:
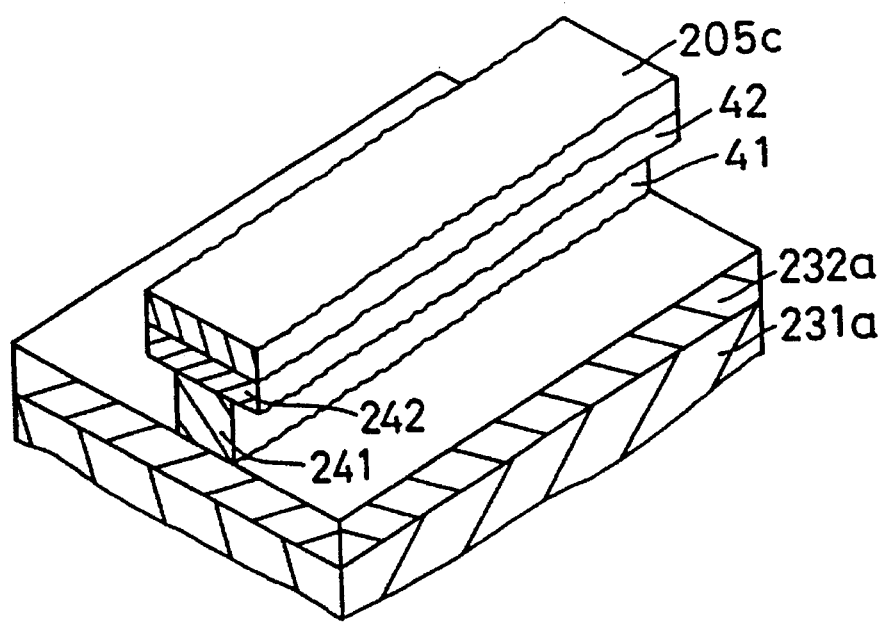
Figure 18:
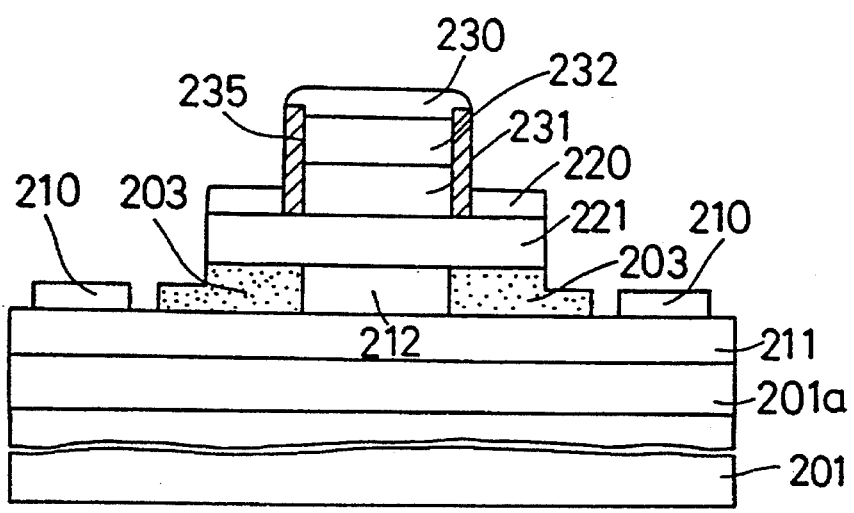
FIG. 18 is a sectional view illustrating an HBT employing side walls for determining positions of base electrodes relative to an emitter.

FIG. 1 is a perspective view illustrating an HBT in accordance with a first embodiment of the present invention. An HBT 100 of this first embodiment is different from the prior art HBT 200 shown in FIG. 10 only in that the emitter contact layer 132 disposed on the AlGaAs emitter layer 231 includes a super-periodic structure 32b comprising five $In_{0.5}Ga_{0.5}As$ layers 2 and four very thin GaAs layers 1 which are alternatingly laminated.

Figure 2:
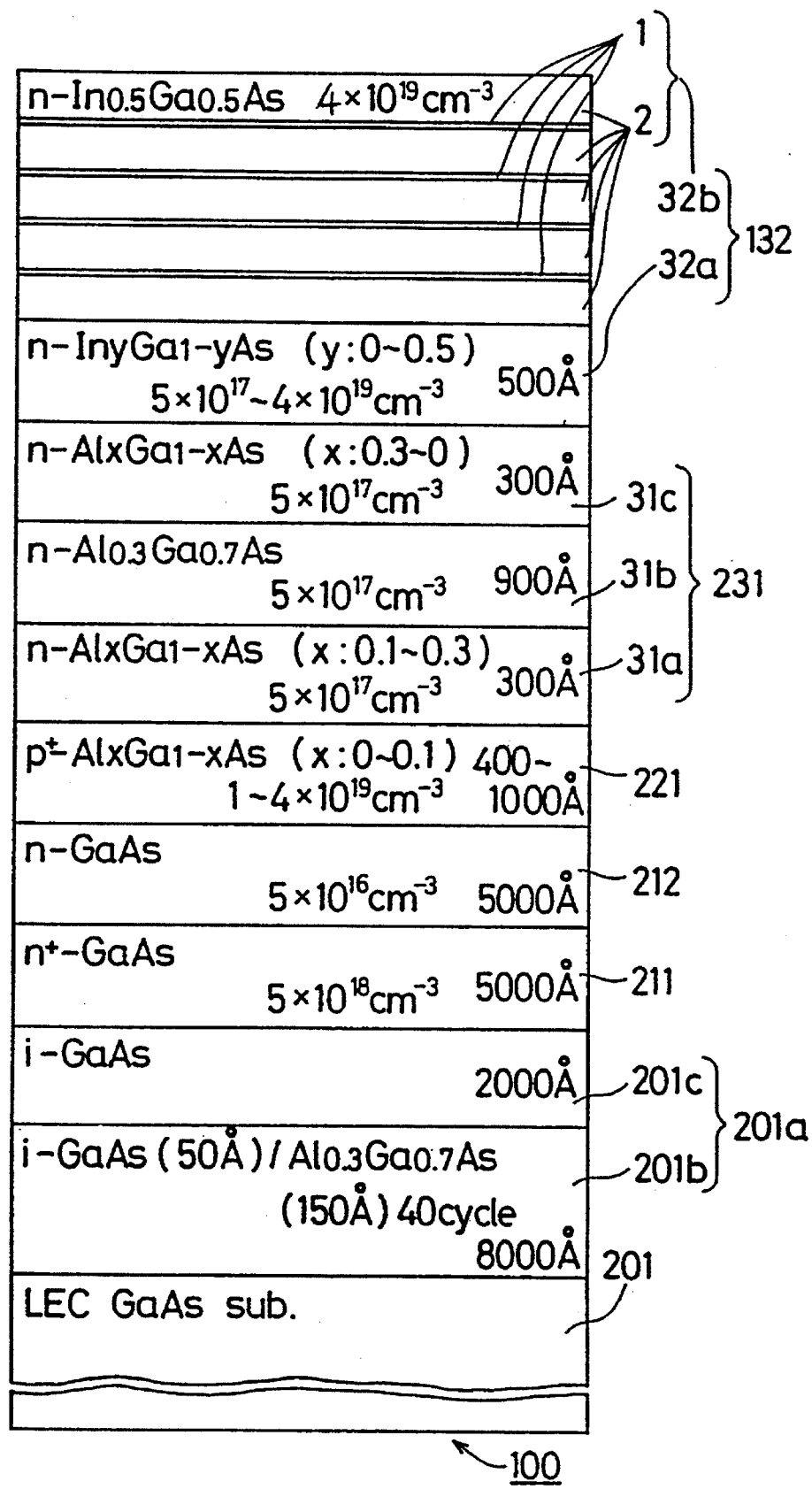
FIG. 2 is a sectional view illustrating a laminated structure of semiconductor layers included in the HBT of FIG. 1.

The laminated structure of semiconductor layers included in the HBT 100 will be described in more detail using FIG. 2. In FIG. 2, a buffer layer 201a is disposed on a LEC (Liquid Encapsulated Czochralski) GaAs substrate 201. The buffer layer 201a comprises a superlattice buffer layer 201b 8000 Å thick and an i type GaAs buffer layer 201c 2000 Å thick. The superlattice buffer layer 201b comprises forty i type GaAs layers each having a thickness of 50 Å and forty $Al_{0.3}Ga_{0.7}As$ layers each having a thickness of 150 Å which are alternatingly laminated.

An $n^+$ type GaAs collector contact layer 211 having a thickness of 5000 Å and a dopant concentration of $5\times10^{18}$ $cm^{-3}$ is disposed on the buffer layer 201a. An n type GaAs collector layer 212 having a thickness of 5000 Å and a dopant concentration of $5\times10^{16}$ $cm^{-3}$ is disposed on the $n^+$ type GaAs layer 211. A $p^+$ type AlGaAs base layer 221 having a thickness of 400~1000 l and a dopant concentration of 1~ $4\times10^{19}$ $cm^{-3}$ is disposed on the collector layer 212. In the AlGaAs base layer 221, the ratio of AlAs mixed crystal is gradually varied upward, i.e., in the growth direction, from 0 to 0.1.

An emitter layer 231 is disposed on the base layer 221. The emitter layer 231 comprises an n type AlGaAs lower graded layer 31a in contact with the base layer 221, an n type $Al_{0.3}Ga_{0.7}As$ center layer 31b, and an n type AlGaAs upper graded layer 31c. The AlGaAs lower graded layer 31a is grown on the base layer 221 to a thickness of 300 Å while gradually increasing the AlAs mixed crystal ratio from 0.1 to 0.3, the $Al_{0.3}Ga_{0.7}As$ center layer 31b is grown on the lower graded layer 31a to a thickness of 900 Å while maintaining the AlAs mixed crystal ratio at 0.3, and the AlGaAs upper graded layer 31c is grown on the center layer 31b to a thickness of 300 Å while gradually decreasing the AlAs mixed crystal ratio from 0.3 to 0. The upper and lower graded layers 31c and 31a and the center layer 31b have the same dopant (Si) concentration of $5\times10^{17}$ $cm^{-3}$.

An emitter contact layer 132 comprising an n type InGaAs graded layer 32a and the n type InGaAs with super-periodic GaAs layer 32b is disposed on the emitter layer 231. The n type InGaAs graded layer 32a is grown on the AlGaAs upper graded layer 31c to a thickness of 500 Å while gradually increasing the InAs mixed crystal ratio from 0 to 0.5. The dopant (Si) concentration of the InGaAs graded layer 32a gradually increases upward from $5\times10^{17}$ $cm^{-3}$ to $4\times10^{19}$ $cm^{-3}$.

The super-periodic layer 32b is 500 Å thick and comprises five n type $In_{0.5}Ga_{0.5}As$ layers 2 and four n type GaAs layers 1 which are alternatingly laminated. The thickness of each GaAs layer 1 is 10 Å, and the interval between adjacent GaAs layers 1 is about 90 Å.

Figure 3:
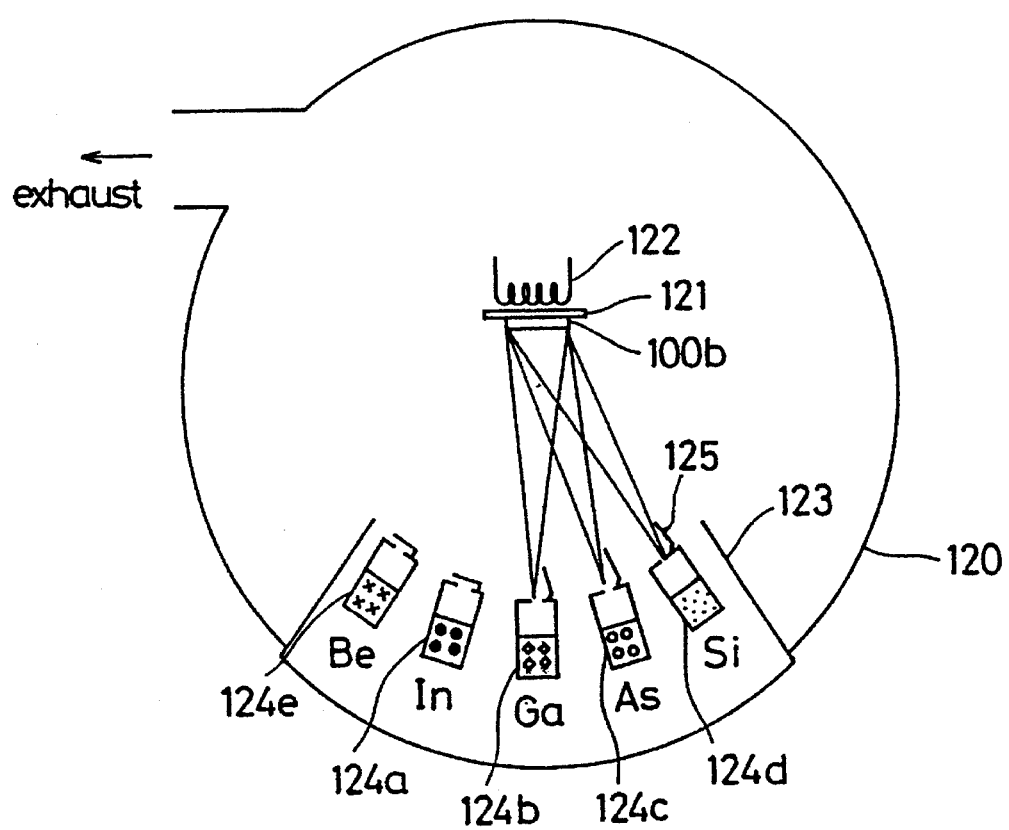
FIG. 3. is a schematic diagram illustrating a molecular beam epitaxy apparatus for producing an emitter contact layer included in the HBT of FIG. 1.

A method for producing the InGaAs with super-periodic GaAs layer 32b using a molecular beam epitaxy is illustrated in FIG. 3. In FIG. 3, reference numeral 120 designates a reaction chamber, numeral 121 designates a wafer supporting stage, numeral 122 designates a heater, numeral 123 designates a shroud, numerals 124a to 124e designate knudsen cells disposed inside the shroud 123, and numeral 125 designates a shutter of the knudsen cell.

Initially, an HBT wafer 100b is mounted on the wafer supporting stage 121 and heated to a prescribed temperature with the heater 122. Then, the shutters 125 of the knudsen cells 124a, 124b, 124c, and 124d respectively containing In, Ga, As, and n type impurity, Si, are opened with the shutter 125 of the knudsen cell 124e containing p type impurity Be being closed, and the respective elements are evaporated and applied to the wafer in the form of molecular beams, whereby the n type $In_{0.5}Ga_{0.5}As$ layer 2 about 90 Å thick having a dopant concentration of $4\times10^{19}$ $cm^{-3}$ is grown on the AlGaAs layer 231 at the surface of the wafer 100b. Then, the shutter 125 of the In knudsen cell 124a is closed and the n type GaAs layer 1 about 10 Å thick is grown on the layer 2.

Thereafter, the n type $In_{0.5}Ga_{0.5}As$ layer 2 and the GaAs. layer 1 are alternatingly grown and, when the growth of the fifth $In_{0.5}Ga_{0.5}As$ layer 2 on the fourth GaAs layer 1 is finished, the shutters of all knudsen cells are closed. Thus, the InGaAs with super-periodic GaAs layer 32b is completed. Since the InGaAs with super-periodic GaAs layer 32b of this first embodiment includes no p type semiconductor layer, the shutter of the Be knudsen cell 124e is closed throughout the process.

Figure 4:
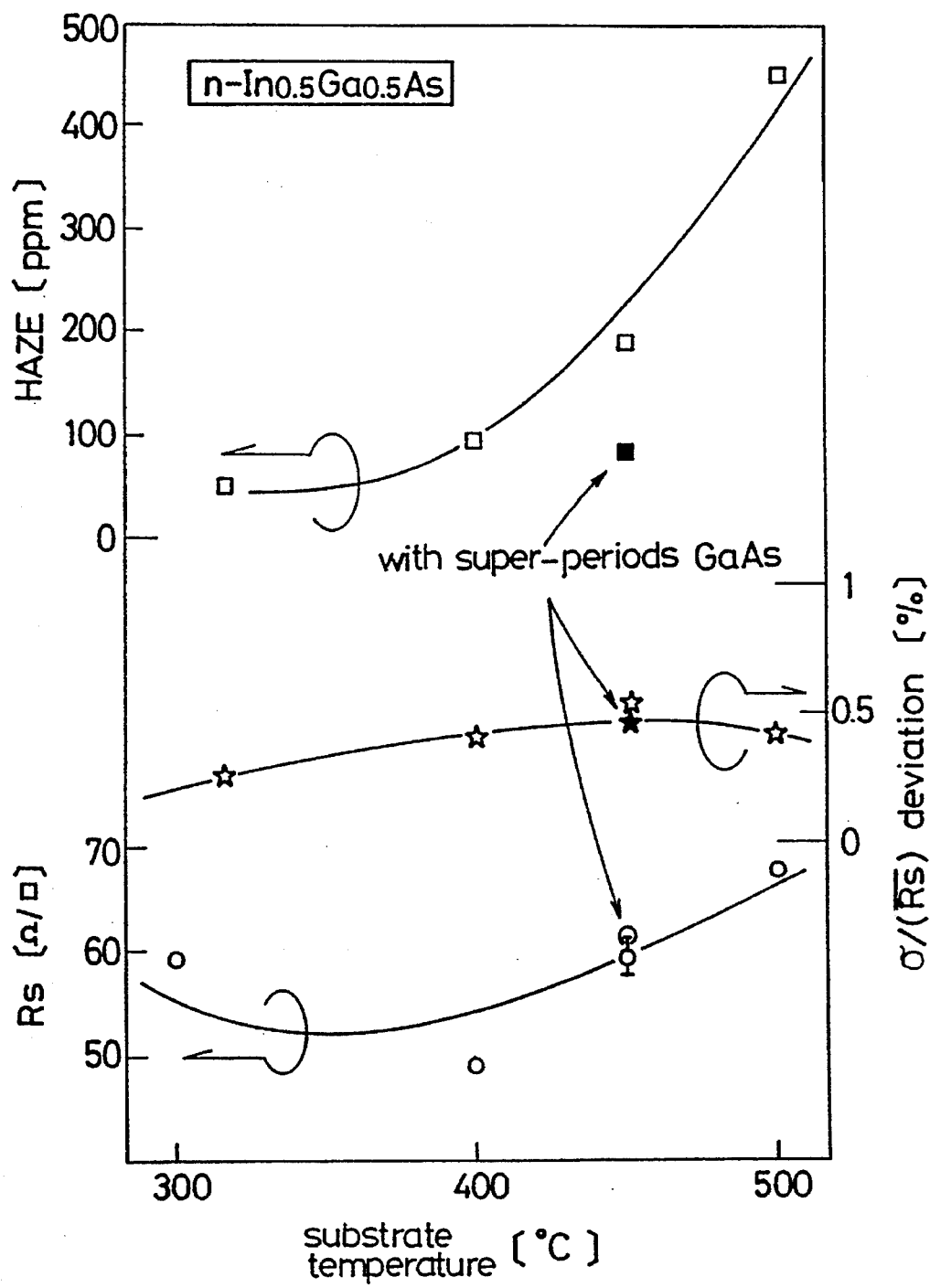
FIG. 4 is a graph illustrating growth temperature dependence of the surface morphology, the sheet resistivity Rs, and the deviation of the sheet resistivity Rs of a super-periodic InGaAs layer included in the emitter contact layer according to the present invention, in comparison with those of an InGaAs emitter contact layer included in a prior art structure.
Figure 5:
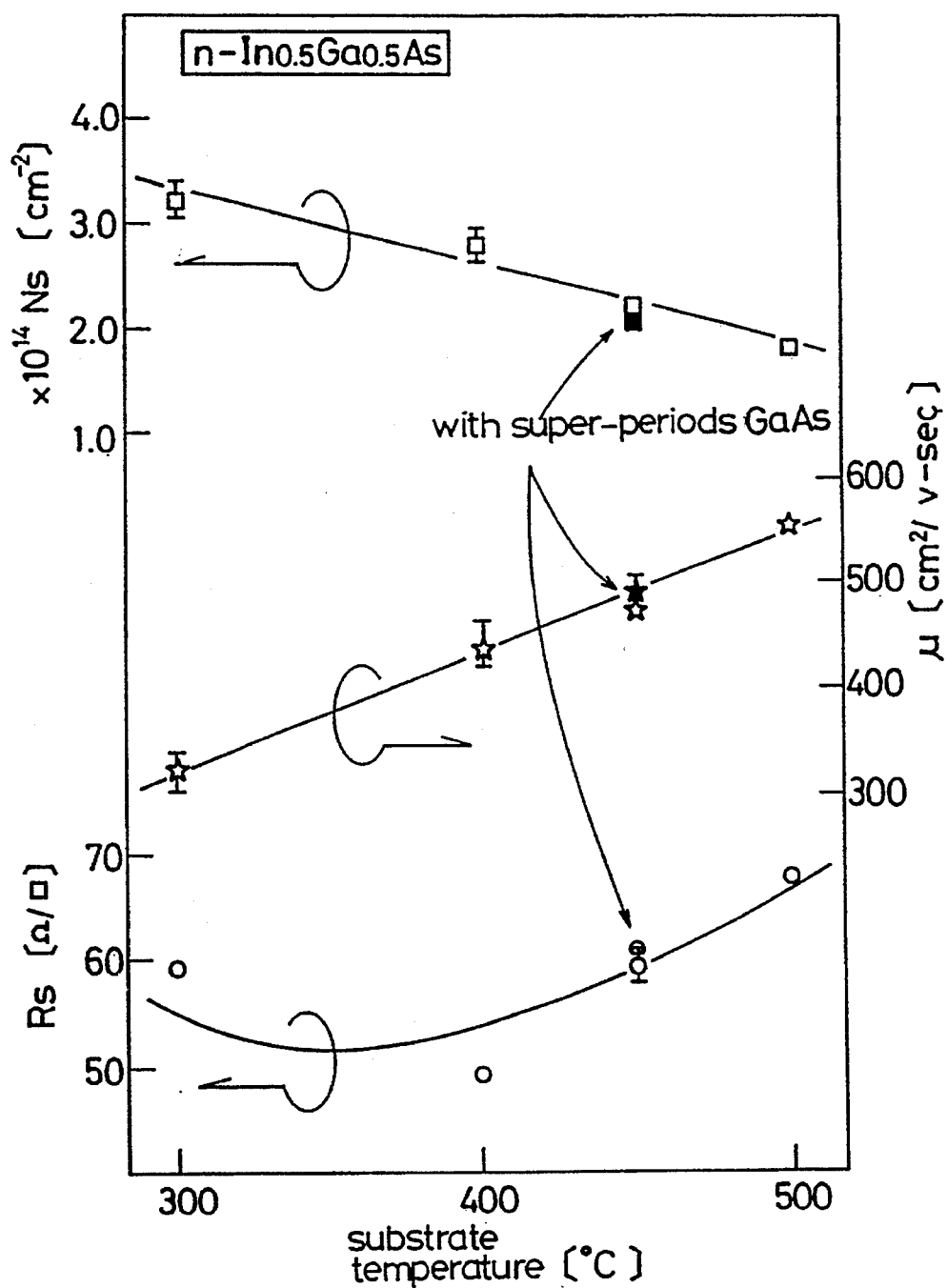
FIG. 5 is a graph illustrating growth temperature dependence of the sheet carrier density Ns and the carrier mobility $\mu$ of the InGaAs emitter contact layer according to the present invention.
Figure 6:
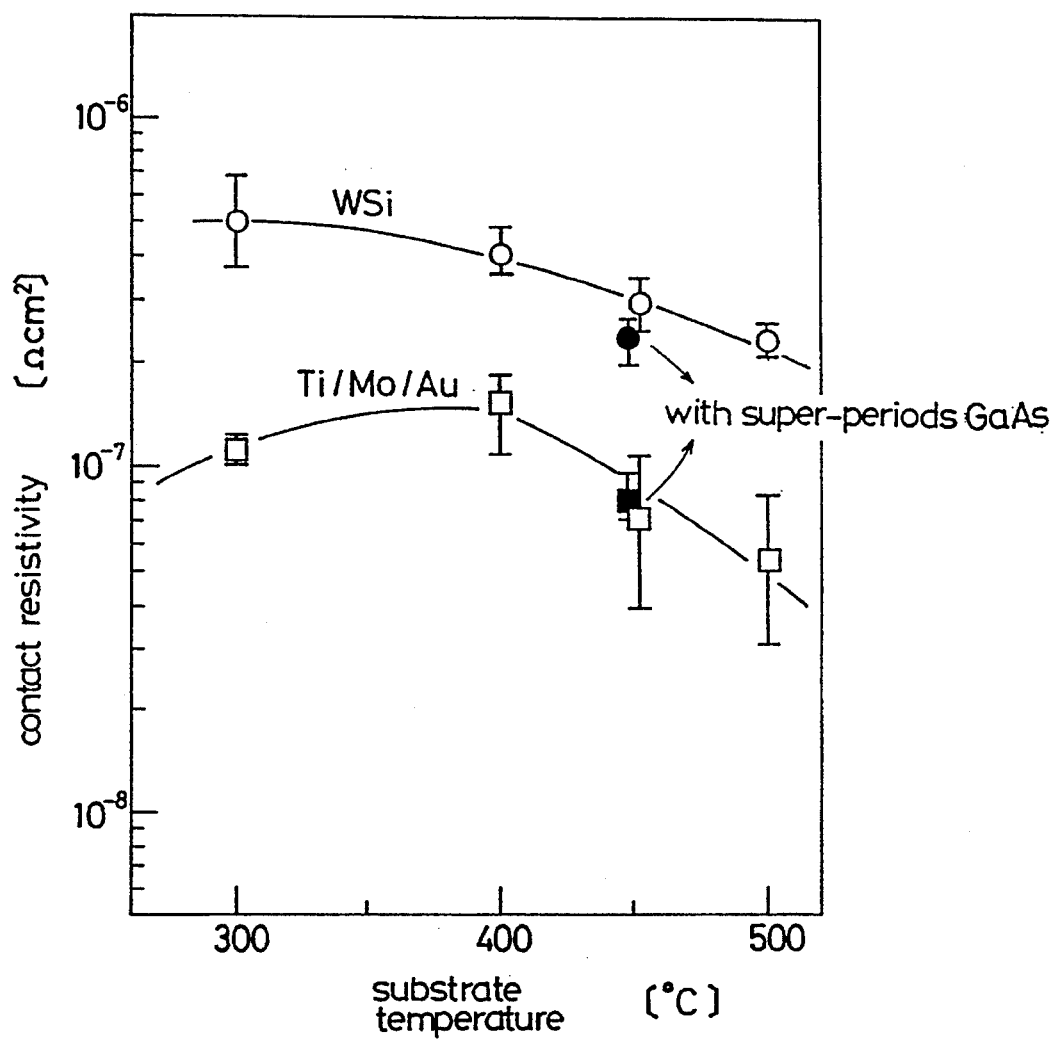
FIG. 6 is a graph illustrating growth temperature dependence of the contact resistivity $\rho c$ of the InGaAs emitter contact layer according to the present invention.

FIGS. 4, 5, and 6 are graphs illustrating the characteristics of the super-periodic InGaAs emitter contact layer 132 of the HBT 100 according to the present invention, in comparison with the characteristics of the $In_{0.5}Ga_{0.5}As$ emitter contact layer 232 of the HBT 200 according to the prior art. FIG. 7(a) is a sectional view of a sample 100a used for measuring the characteristics of the emitter contact layer 132 of the present invention, and FIG. 7(b) is a sectional view of a sample 200a used for measuring the characteristics of the emitter contact layer 232 according to the prior art.

The sample 200a comprises an i type GaAs layer 201b 2000 Å thick, an InGaAs graded layer 32a 500 Å thick (InAs mixed crystal ratio: 0~0.5), and an $In_{0.5}Ga_{0.5}As$ layer 32 500 Å thick which are successively grown on a LEC GaAs substrate 201. The sample 100a includes the super-periodic InGaAs layer 32b shown in FIG. 2 in place of the $In_{0.5}Ga_{0.5}As$ layer 32 of the sample 200a.

FIG. 4 illustrates growth temperature dependence of the surface morphology, the sheet resistivity, and the deviation of the sheet resistivity of an InGaAs layer grown on a GaAs layer. In FIG. 4, HAZE showing the extent of roughness of the surface morphology is a value of the irregular reflectance of incident laser light standardized to incident light. As the HAZE increases, the specular surface is degraded. The sheet resistivity Rs is the inverse of the sheet conductivity of the InGaAs layer. The deviation of the sheet resistivity in a wafer is represented by the standard deviation σ and the average value Rs, as σ/Rs.

In FIG. 4 shows the surface morphology, the sheet resistivity, the deviation of the sheet resistivity, respectively, and contact resistivity, of the InGaAs layer 32 of the sample 200a according to the prior art, and of the super-periodic InGaAs layer 32b of the sample 100a according to the present invention.

As shown in FIG. 4, in the super-periodic InGaAs layer 32b of the present invention, a favorable specular surface, i.e., HAZE≦100 ppm that can be applied to an actual device, is realized at the growth temperature 450° C. with no significant increase in the sheet resistivity or deviation of the sheet resistivity. Although the super-periodic InGaAs layer of the present invention appears to be inferior to the prior art InGaAs layer grown at 400° C., since it is most important to suppress the contact resistivity, the super-periodic InGaAs layer is superior to the prior art InGaAs layer if the contact resistivity is taken into account (see FIG. 6).

Figure 8A:
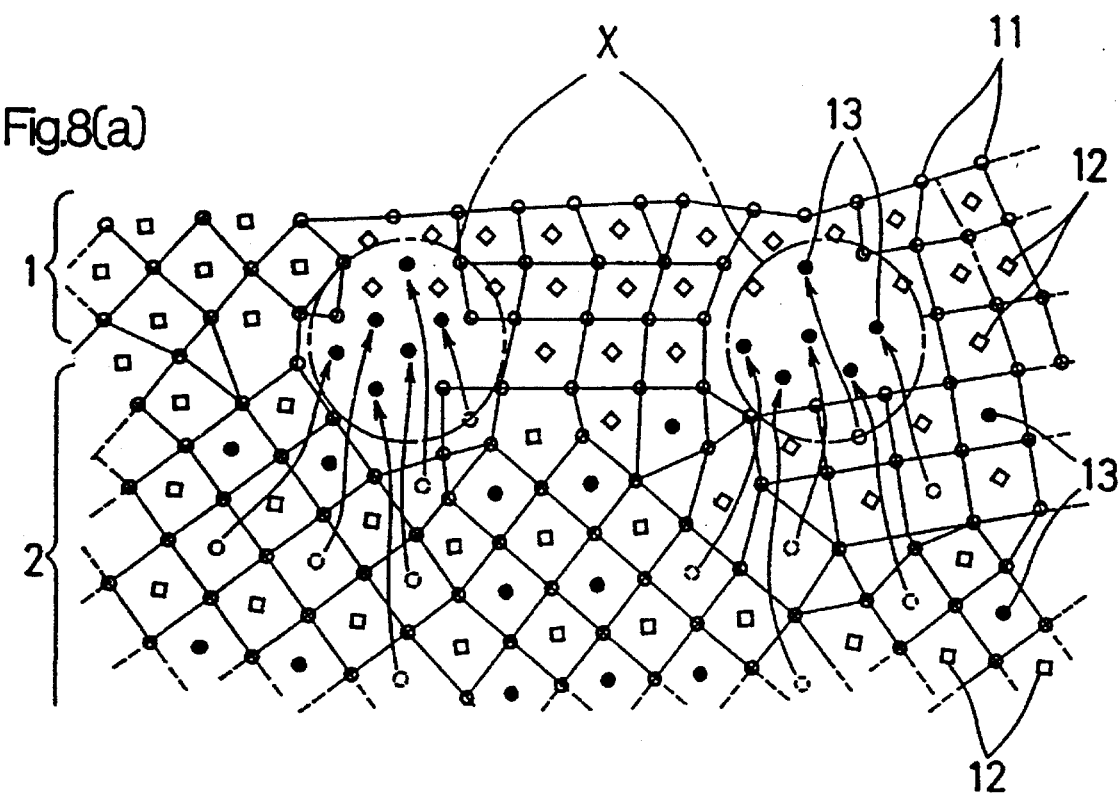
FIGS. 8(a) and 8(b) are schematic diagrams for explaining a mechanism in which the surface morphology of the InGaAs with super-periodic GaAs layer is improved.
Figure 8B:
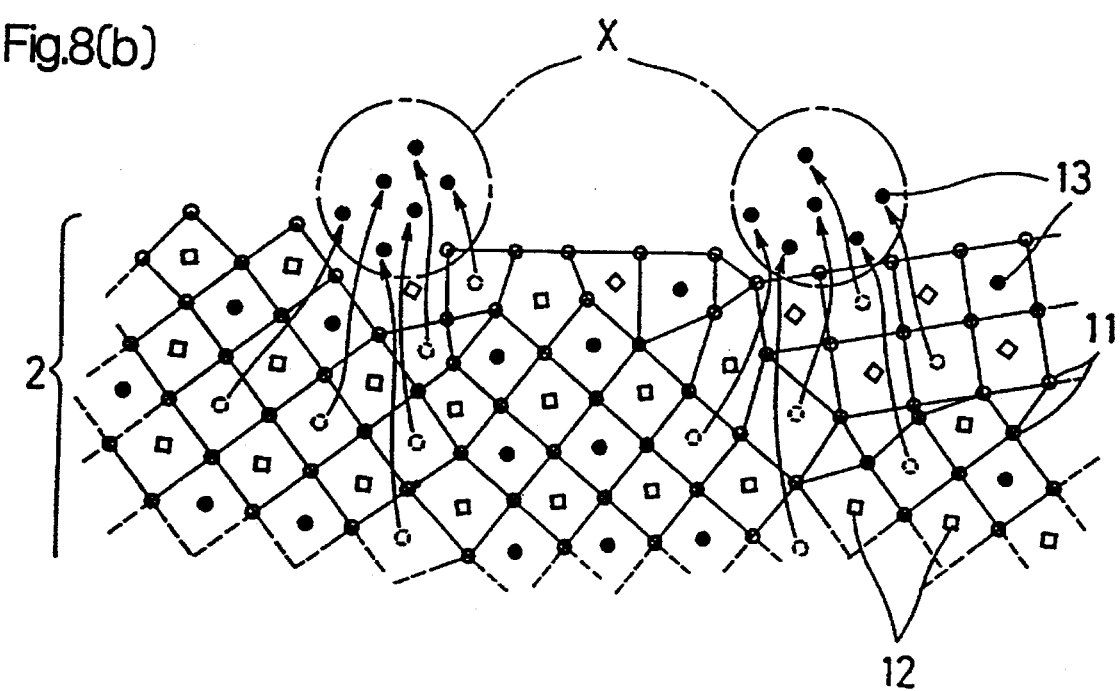

FIGS. 8(a) and 8(b) schematically illustrate a mechanism for improving the surface morphology. In the prior art structure shown in FIG. 8(b), In atoms 13 are segregated and lost at the surface of the InGaAs layer 2. On the other hand, in the structure of FIG. 8(a) according to the present invention, since the very thin GaAs layer 1 is present on the InGaAs layer 2, portions X of the InGaAs layer 2 where In atoms are segregated are covered with the GaAs layer 1 including no In atoms and, furthermore, the lattice constant of the GaAs layer 1 is smaller than that of the InGaAs layer 2, whereby the segregation of In atoms and the loss of In atoms from the surface are suppressed by the GaAs layer 1.

FIG. 5 illustrates results of evaluation in which components of the sheet resistivity Rs are measured at different growth temperatures by Hall measurement. FIG. 5 shows the electron density, the carrier mobility, and the sheet resistivity of the InGaAs layer 23 of the sample 200a according to the prior art, the electron density, the carrier mobility, and the sheet resistivity of the super-periodic InGaAs layer 32b of the sample 100a according to the present invention. The sheet resistivity Rs is represented as follows.

$$Rs = \rho_C(d/s)$$

$$\rho_C = 1/(q\, n_e \mu_e)$$

where S is the area, d is the thickness of the emitter contact layer, $\rho_C$ is the contact resistivity, q is the unit electric charge, $n_e$ is the electron density per unit volume, and $\mu_e$ is the carrier mobility.

In FIG. 5, Ns is a value attained by converting the electron density per unit volume $n_e$ into the electron density per unit square. Strictly speaking, since the emitter contact layer 132 includes the graded layer 32a, a correction according to the variation in the In composition is necessary.

As shown in FIG. 5, the electron density and the electron mobility of the super-periodic InGaAs layer according to the present invention are not very much different from those of the prior art InGaAs layer.

Since the $In_yGa_{1-y}As$ layer has smaller energy band gap and higher intrinsic carrier density than those of the GaAs layer, it is favorable when an ohmic electrode is formed thereon. Therefore, the insertion of the GaAs layer into the $In_yGa_{1-y}As$ layer adversely affects the formation of the ohmic electrode. However, the GaAs layer employed in this first embodiment is very thin so that most of the operating current can pass through that layer and, therefore, the surface morphology is improved without increasing resistivity.

FIG. 6 illustrates the contact resistivities of the super-periodic InGaAs layer (emitter contact layer) at different growth temperatures in comparison with those of the InGaAs layer according to the prior art.

The resistivities are measured with respect to a three-layer structure of Ti/Mo/Au, an emitter metal employed in an actual HBT, and a single-layer structure of WSi that is a refractory metal of the highest reliability. FIG. 6 shows the contact resistivities of the prior art InGaAs layer with the WSi layer and the Ti/Mo/Au layer, respectively, and the contact resistivities of the super-periodic InGaAs layer with the WSi layer and the Ti/Mo/Au layer, respectively.

In case of the Ti/Mo/Au layer, although the average of the contact resistivities at the growth temperature of 450° C. is a little higher than that of the prior art, the range of the variation of the contact resistivity is significantly reduced compared to the prior art, which means that the uniformity of the contact resistivity in a wafer is significantly improved.

With the WSi layer, the lowest contact resistivity between the WSi layer and the super-periodic InGaAs layer according to the present invention is attained in the measuring temperature range (300° C.–500° C.), and the variation of the contact resistivity is suppressed to that of the prior art.

In the production of HBTs, it is very important to reduce the contact resistivity of the InGaAs layer grown on the GaAs layer with improved surface morphology and, therefore, the fact that a reduced contact resistivity is attained with the highly-reliable refractory metal, i.e., WSi, is of great significance.

As described above, according to the first embodiment of the present invention, the n type $In_yGa_{1-y}As$ emitter contact layer 32b about 500 Å thick is of the super-periodic structure including four n type GaAs layers 1 each having a thickness of 10 Å, so that the surface morphology of the InGaAs layer 32b is improved with no increase in the contact resistivity, the sheet resistivity, and the deviation of the sheet resistivity in a wafer. Therefore, fine patterns can be formed on the surface of the emitter contact layer, whereby a fine emitter and a fine emitter electrode are achieved at high yield.

Further, in addition to the reduction of the contact resistivity, the uniformity of the contact resistivity in a wafer is significantly improved. Therefore, the HBT according to the present invention is very useful when a monolithic microwave IC (MMIC) is fabricated.

In the HBT with the super-periodic structure, the threshold $f_T$ of the operating frequency at which the HBT operates with a desired current amplification factor is increased to 80 GHz or more, resulting in a high-performance HBT.

Figure 9:
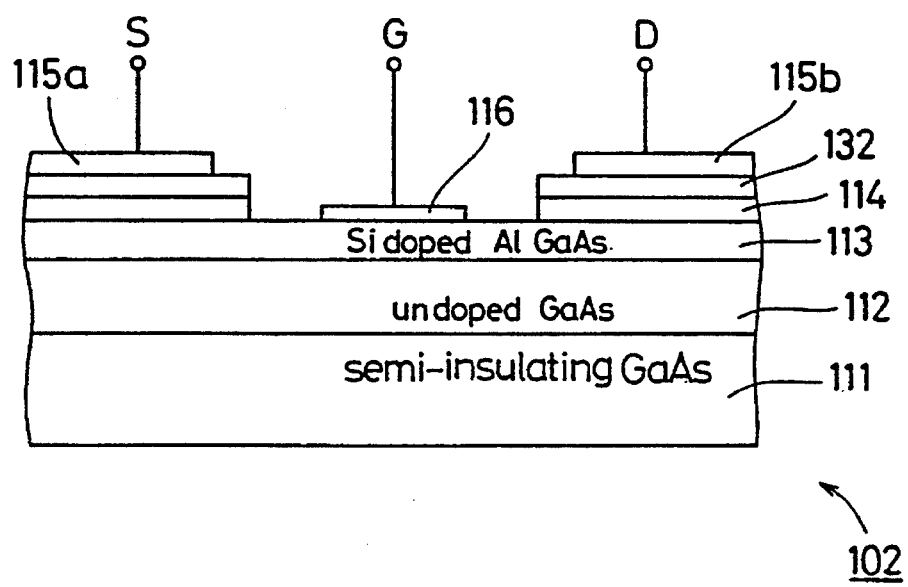
FIG. 9 is a sectional view illustrating a HEMT in accordance with a second embodiment of the present invention.

FIG. 9 is a sectional view illustrating a HEMT in accordance with a second embodiment of the present invention. In FIG. 9, an undoped GaAs layer 112 is disposed on a semi-insulating GaAs substrate 111. An n type AlGaAs layer 113 is disposed on the undoped GaAs layer 112. A two-dimensional electron gas layer (not shown) is disposed in the undoped GaAs layer 112 contacting the interface between the AlGaAs layer 113 and the GaAs layer 112. A gate electrode 116 comprising Al is disposed on a center part of the n type AlGaAs layer 113. Spaced apart n type GaAs layers 114 are disposed on the n type AlGaAs layer 113 at opposite sides of the gate electrode 116. Source and drain contact layers 132 are disposed on the respective n type GaAs layers 114. Source and drain electrodes 115a and 115b are disposed on the respective source and drain contact layers 132.

In this second embodiment, the source and drain contact layers 132 are have the super-periodic structure in which four GaAs layers each having a thickness of 10 Å are inserted into an n type InGaAs contact layer at intervals of 90 Å. Since the GaAs layer is only 10 Å thick, most of the operating current passes through the layer by tunneling effect. The interval of 90 Å is wider than the critical thickness that maintains the pseudomorphic state of the InGaAs crystal on the GaAs crystal.

Also in this second embodiment of the present invention, as in the above-described first embodiment, the InGaAs source and drain contact layer 132 can be grown at a high temperature with improved surface morphology, so that a HEMT having improved operating characteristics is produced at good yield.

The contact layer of this super-periodic structure may be applied to ohmic contact layers of pseudomorphic HEMTs and MESFETs.

What is claimed is:

1. A semiconductor device including:

a GaAs layer; and an InGaAs layer disposed on said GaAs layer through which operating current flows perpendicular to said InGaAs layer, wherein said InGaAs layer includes a plurality of GaAs tunneling layers through which most of the operating current passes by tunneling, said GaAs tunneling layers being disposed within said InGaAs layer and spaced at intervals, each interval being larger than a critical thickness at which a pseudomorphic state of said InGaAs layer on said GaAs layer is maintained.

2. A semiconductor device including:

a GaAs layer;

a lower InGaAs layer disposed on said GaAs layer with a gradually increasing ratio of InAs, from 0 to a prescribed value, and having a thickness larger than a critical thickness at which a pseudomorphic state of said lower InGaAs on said GaAs is maintained;

an upper InGaAs layer disposed on said lower InGaAs layer with the ratio of InAs at the prescribed value, having a thickness larger than the critical thickness, on which another film is to be formed, and through the thickness of which an operating current flows; and a plurality of GaAs tunneling layers disposed within said lower InGaAs layer and spaced at intervals, each interval being larger than the critical thickness, most of the operating current passing through said tunneling GaAs layers by tunneling.

3. The semiconductor device of claim 2 wherein the ratio of InAs in said lower InGaAs layer gradually increases from 0 to 0.5, and said upper InGaAs layer is a contact layer having a ratio of InAs of 0.5 and on which an electrode is to be formed.

4. A heterojunction bipolar transistor including:

a GaAs emitter layer;

an emitter contact layer disposed on said GaAs emitter layer comprising a lower InGaAs layer disposed on said GaAs emitter layer and having a gradually increasing ratio of InAs, from 0 to a prescribed value, and a thickness larger than a critical thickness at which a pseudomorphic state of said lower InGaAs layer on said GaAs emitter layer is maintained, and an upper InGaAs layer disposed on said lower InGaAs layer with the ratio of InAs at the prescribed value and having a thickness larger than the critical thickness; and a plurality of GaAs tunneling layers disposed within said lower InGaAs layer and spaced at intervals, each interval being larger than the critical thickness, most of the operating current passing through said GaAs tunneling layers by tunneling.

5. A high electron mobility transistor including:

an undoped GaAs layer;

an n type AlGaAs layer disposed on said undoped GaAs layer;

an electron supply layer disposed in a part of said undoped GaAs layer contacting an interface between said undoped GaAs layer and said n type AlGaAs layer;

a gate electrode disposed on a part of said AlGaAs layer;

spaced apart n type contacts disposed on said AlGaAs layer at opposite sides of said gate electrode and including n type GaAs contact layers and n type InGaAs contact layers;

spaced apart source and drain electrodes disposed on respective InGaAs contact layers; and a plurality of GaAs tunneling layers disposed within said InGaAs contact layer and spaced apart at intervals, each interval being larger than a critical thickness at which a pseudomorphic state of crystalline InGaAs on crystalline GaAs is maintained and through which most of an operating current passes by tunneling.

6. The semiconductor device of claim 1 wherein said GaAs tunneling layers are about one nanometer thick, said InGaAs layer is $In_{0.5}Ga_{0.5}As$, and each interval is at least nine nanometers.

7. The semiconductor device of claim 2 wherein said GaAs tunneling layers are about one nanometer thick, said InGaAs layer is $In_{0.5}Ga_{0.5}As$, and each interval is at least nine nanometers.

8. The semiconductor device of claim 4 wherein said GaAs tunneling layers are about one nanometer thick, said InGaAs layer is $In_{0.5}Ga_{0.5}As$, and each interval is at least nine nanometers.

9. The semiconductor device of claim 5 wherein said GaAs tunneling layers are about one nanometer thick, said InGaAs layer is $In_{0.5}Ga_{0.5}As$, and each interval is at least nine nanometers.

10. The heterojunction bipolar transistor of claim 4 including a GaAs collector layer and an AlGaAs base layer disposed on said collector layer, said GaAs emitter layer being disposed on said base layer.

* * * * *